United States Patent
Kang et al.

(10) Patent No.: US 11,706,904 B2
(45) Date of Patent: Jul. 18, 2023

(54) ELECTRONIC DEVICE INCLUDING HEAT DISSIPATION MEMBER

(71) Applicant: Samsung Electronics Co., Ltd., Gyeonggi-do (KR)

(72) Inventors: Jooyoung Kang, Gyeonggi-do (KR); Myunghoon Kwak, Gyeonggi-do (KR); Baekeun Cho, Gyeonggi-do (KR); Hyunsuk Kim, Gyeonggi-do (KR); Sanghyuk Park, Gyeonggi-do (KR); Soohyun Seo, Gyeonggi-do (KR); Nakhyun Choi, Gyeonggi-do (KR); Yangwook Kim, Gyeonggi-do (KR); Hyunju Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 64 days.

(21) Appl. No.: 17/512,168

(22) Filed: Oct. 27, 2021

(65) Prior Publication Data
US 2022/0151106 A1 May 12, 2022

Related U.S. Application Data

(63) Continuation of application No. PCT/KR2021/014390, filed on Oct. 15, 2021.

(30) Foreign Application Priority Data

Nov. 6, 2020 (KR) .......... 10-2020-0147415
Feb. 18, 2021 (KR) .......... 10-2021-0021817

(51) Int. Cl.
*H05K 7/20* (2006.01)
*H04M 1/02* (2006.01)
(Continued)

(52) U.S. Cl.
CPC ........ *H05K 7/20472* (2013.01); *H04M 1/026* (2013.01); *H04M 1/0237* (2013.01);
(Continued)

(58) Field of Classification Search
CPC .......... H05K 7/20954–20963; H05K 7/2039–20518; H05K 7/20336;
(Continued)

(56) References Cited

U.S. PATENT DOCUMENTS 8,711,566 B2 * 4/2014 O'Brien ............... G06F 1/1652
361/724
10,721,837 B2 * 7/2020 Lee ..................... H04M 1/0266
(Continued)

FOREIGN PATENT DOCUMENTS

JP 2005-223561 8/2005
JP 2008-294043 12/2008
(Continued)

OTHER PUBLICATIONS

International Search Report dated Jan. 10, 2022 issued in counterpart application No. PCT/KR2021/014390, 10 pages.

*Primary Examiner* — Zachary Pape
(74) *Attorney, Agent, or Firm* — The Farrell Law Firm, P.C.

(57) ABSTRACT

An electronic device is provided, which may include a first housing; a second housing configured to accommodate at least a portion of the first housing and guide a sliding movement of the first housing; a display including a first display area disposed on the first housing and a second display area extending from the first display area; a PCB configured to accommodate at least one electronic component; a support member configured to support the PCB; a side wall member connected to the support member and facing at least a portion of the first housing; a heat dissipa-
(Continued)

tion sheet configured to receive heat from the at least one electronic component, the heat dissipation sheet being disposed on the support member and the side wall member; and a heat dissipation member disposed on the side wall member and facing the heat dissipation sheet.

20 Claims, 18 Drawing Sheets

(51) Int. Cl.
  *G06F 1/20* (2006.01)
  *H05K 9/00* (2006.01)
(52) U.S. Cl.
  CPC ..... *H05K 7/20336* (2013.01); *H05K 7/20409* (2013.01); *H05K 9/0054* (2013.01); *G06F 1/203* (2013.01)
(58) Field of Classification Search
  CPC .. H05K 9/0054; H04M 1/0237; H04M 1/026; G06F 1/203
  See application file for complete search history.

(56) References Cited

U.S. PATENT DOCUMENTS

| | | |
|---|---|---|
| 2005/0176471 A1 | 8/2005 | Masuda et al. |
| 2013/0058063 A1 | 3/2013 | O'Brien |
| 2015/0220122 A1 | 8/2015 | Rhee et al. |
| 2015/0241935 A1 | 8/2015 | Jang et al. |
| 2017/0006738 A1 | 1/2017 | Lee et al. |
| 2018/0014417 A1* | 1/2018 | Seo ........................ H05K 1/189 |
| 2018/0172900 A1 | 6/2018 | Ahn et al. |
| 2019/0393433 A1 | 12/2019 | Dagn et al. |
| 2020/0060043 A1 | 2/2020 | Lee et al. |
| 2020/0107458 A1 | 4/2020 | Park |
| 2020/0192431 A1 | 6/2020 | Shin et al. |
| 2020/0205301 A1 | 6/2020 | Song |

FOREIGN PATENT DOCUMENTS

| | | |
|---|---|---|
| JP | 2010-093557 | 4/2010 |
| KR | 1020140031358 | 3/2014 |
| KR | 1020150091873 | 8/2015 |
| KR | 1020170004068 | 1/2017 |
| KR | 1020170097541 | 8/2017 |
| KR | 1020140125530 | 1/2018 |
| KR | 1020180006533 | 1/2018 |
| KR | 1020180071028 | 6/2018 |
| KR | 1620190052105 | 5/2019 |
| KR | 1020190087631 | 7/2019 |
| KR | 1020200036409 | 4/2020 |
| KR | 1020200073083 | 6/2020 |
| KR | 1020200076103 | 6/2020 |
| KR | 1020220060861 | 5/2022 |
| WO | WO 2017/098195 | 6/2017 |

* cited by examiner

ELECTRONIC DEVICE INCLUDING HEAT DISSIPATION MEMBER

CROSS-REFERENCE TO RELATED APPLICATIONS

This application is a Bypass Continuation application of International Application No. PCT/KR2021/014390, which was filed on Oct. 15, 2021, and is based on and claims priority under 35 U.S.C. § 119 to Korean Patent Application No. 10-2021-0021817, filed on Feb. 18, 2021, in the Korean Intellectual Property Office, and to Korean Patent Application No. 10-2020-0147415, filed on Nov. 6, 2020, in the Korean Intellectual Property Office, the entire disclosure of each of which is incorporated herein by reference herein in its entirety.

BACKGROUND

1. Field

The disclosure relates generally to an electronic device including a heat dissipation member.

2. Description of Related Art

Due to the development of the information and communication technology and semiconductor technology, various functions are being integrated into a portable electronic device. For example, an electronic device may implement various functions, such as a communication function, an entertainment function (e.g., a game function), a multimedia function (e.g., a music/video reproduction function), a communication and security function for mobile banking or the like, a schedule management function, and an e-wallet function. Additionally, electronic devices are being miniaturized so that a user can conveniently carry the electronic devices.

As mobile communication services extend to the multimedia service area, a size of a display of an electronic device should increase in order to allow users to fully utilize the multimedia service as well as a voice call or short message service. However, the size of the display of the electronic device is in a trade-off relationship with the miniaturization of the electronic device.

SUMMARY

An electronic device (e.g., a portable terminal) may include a display having a flat surface or a flat surface and a curved surface. An electronic device including a display may have a limitation in implementing a screen that is larger than the size of the electronic device itself due to a fixed display structure. Accordingly, electronic devices including a rollable display are being researched.

Electronic devices are being produced with reduced sizes and weights in order to maximize portability and convenience for users, and integrated components are being mounted in smaller spaces for high performance. Accordingly, due to high performance, components used in an electronic device may generate heat, which may affect components adjacent thereto, possibly degrading the performance of the electronic device.

In implementing a rollable electronic device, it may be difficult to secure a heat dissipation structure while allowing structures of the electronic device to move (e.g., slide) relative to each other. For example, in a rollable electronic device, spaces in which a display slides or mechanical components for the slide movement of the display are required. Therefore, it may be difficult to secure a heat dissipation structure in the rollable electronic device, while securing portability of the electronic device through miniaturization.

According to an embodiment of the disclosure, an electronic device is provided, which includes a heat dissipation structure capable of transferring heat generated by an electronic component in a width direction of the electronic device.

However, the problems addressed in the disclosure are not limited to the above-mentioned problems, and may be variously expanded without departing from the spirit and scope of the disclosure.

According to an embodiment of the disclosure, an electronic device includes a first housing; a second housing configured to accommodate at least a portion of the first housing and guide a sliding movement of the first housing; a display including a first display area disposed on the first housing and a second display area extending from the first display area; a printed circuit board (PCB) configured to accommodate at least one electronic component; a support member configured to support the PCB; a side wall member connected to the support member and facing at least a portion of the first housing; a heat dissipation sheet configured to receive heat from the at least one electronic component, the heat dissipation sheet being disposed on the support member and the side wall member; and a heat dissipation member disposed on the side wall member and facing the heat dissipation sheet.

According to another embodiment of the disclosure, an electronic device includes a first housing; a second housing configured to accommodate at least a portion of the first housing and guide a sliding movement of the first housing; a display including a first display area disposed on the first housing and a second display area extending from the first display area; a PCB disposed in the second housing and configured to accommodate at least one electronic component; a support structure configured to support the PCB, the support structure including a support member facing the at least one electronic component and a side wall member extending from the support member; a heat dissipation sheet disposed on the support member and the side wall member; and at least one hinge module connected to the first housing and the side wall member.

In an electronic device according to an embodiment of the disclosure, heat generated by an electronic component may be diffused in a widthwise direction of the electronic device using a heat dissipation member disposed on a side wall member.

In an electronic device according to an embodiment of the disclosure, heat generated by an electronic component may be transferred to an outside of a hinge module or the electronic device.

In addition, various effects directly or indirectly understood through this document can be provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
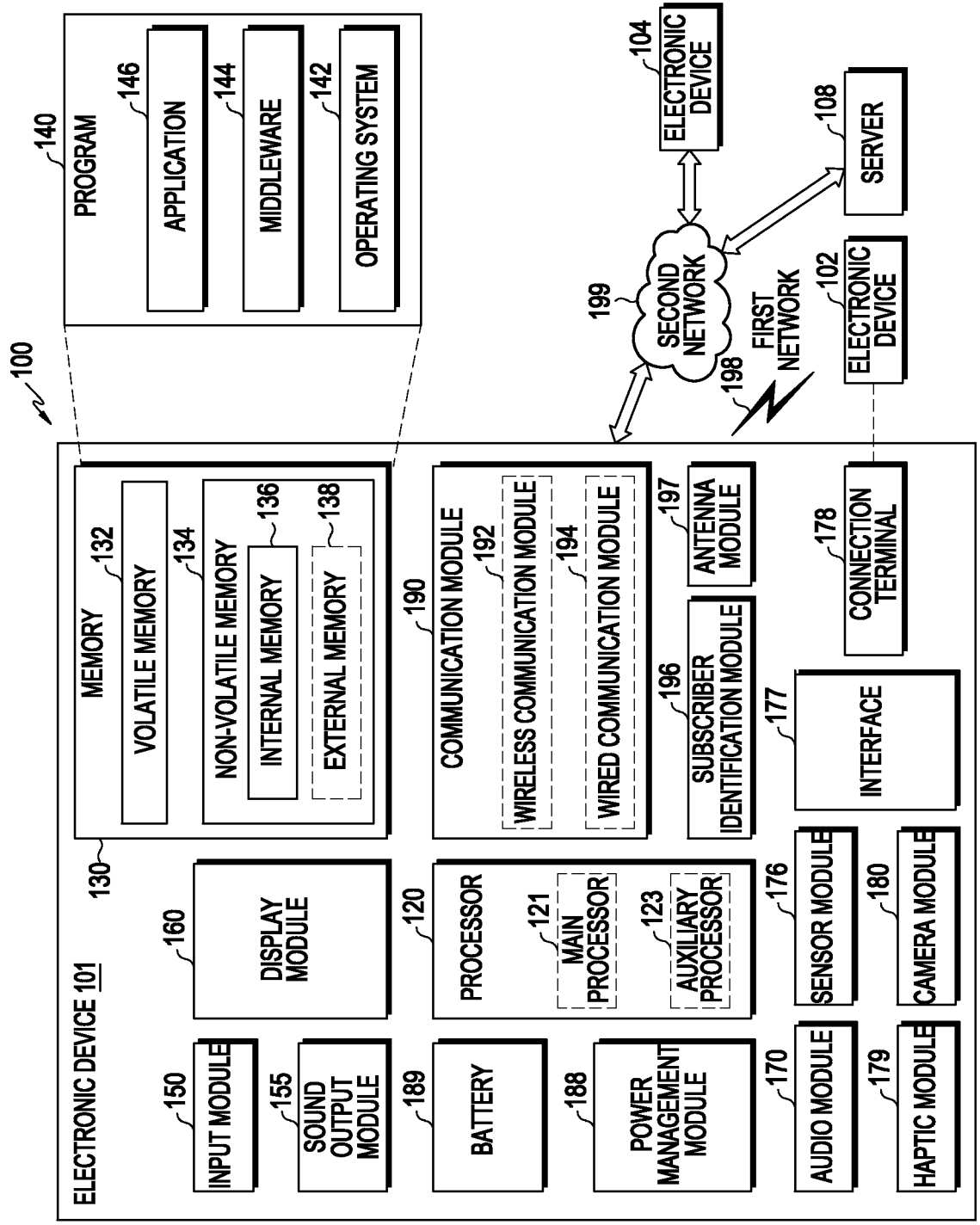
FIG. 1 illustrates an electronic device in a network environment according to an embodiment.

FIG. 1 illustrates an electronic device in a network environment according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an ISP or a CP) may be implemented as part of another component (e.g., the camera module 180 or the communication module 190) functionally related to the auxiliary processor 123. According to an embodiment, the auxiliary processor 123 (e.g., the NPU) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent DNN (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or IR data association (IrDA)) or the second network 199 (e.g., a long-range communication network, such as a legacy cellular network, a $5^{TH}$ generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a PCB). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a PCB, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
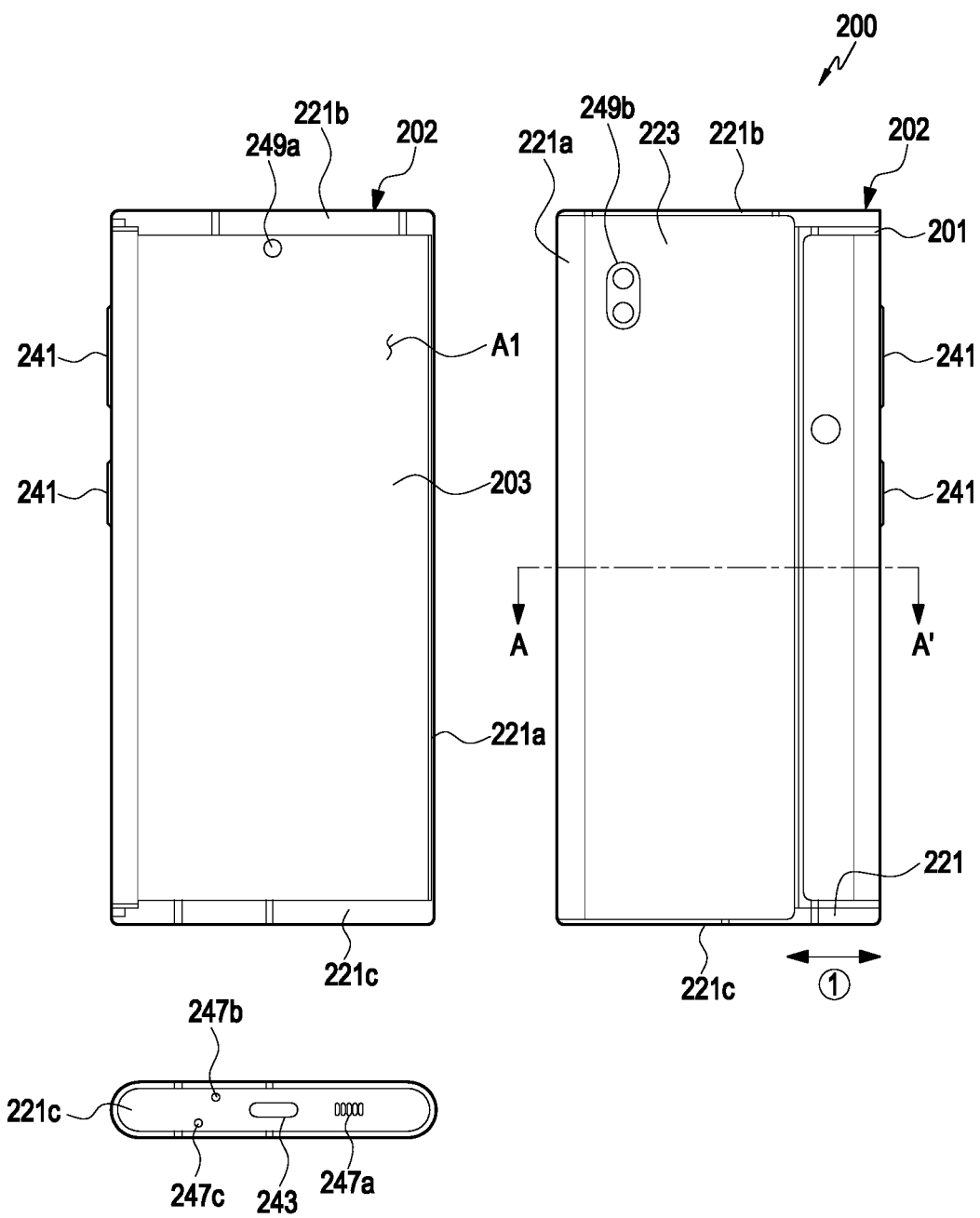
FIG. 2 illustrates a second display area of a flexible display being accommodated in a second housing, according to an embodiment.
Figure 3:
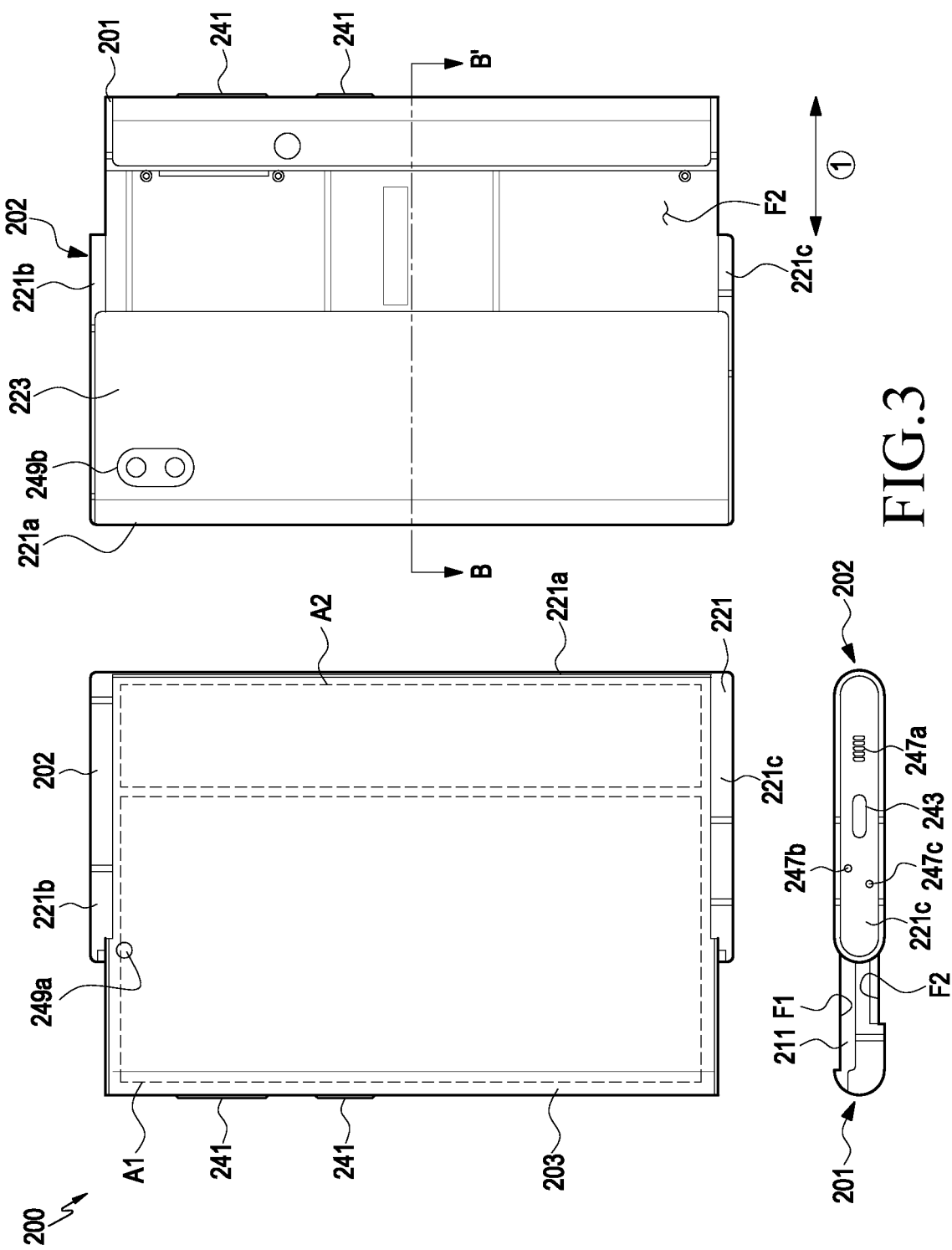
FIG. 3 illustrates a second display area of a flexible display exposed to an outside of a second housing, according to an embodiment.

FIG. 2 illustrates a second display area of a flexible display being accommodated in a second housing, according to an embodiment. Specifically, FIG. 2 illustrates a first housing 201 closed relative to a second housing 202, i.e., a closed state of an electronic device 200. FIG. 3 illustrates a second display area of a flexible display being exposed to an outside of a second housing, according to an embodiment. Specifically, FIG. 3 illustrates the first structure 201 open relative to the second structure 202, i.e., an open state of the electronic device 200.

Referring to FIGS. 2 and 3, the electronic device 200 includes the second housing 202 and the first housing 201, wherein the first housing 201 is disposed to be movable relative to the second housing 202. The second housing 202 may be disposed to be slidable on the first housing 201. The first housing 201 may be disposed to be reciprocable by a predetermined distance in the illustrated direction of arrow ①, relative to the second housing 202.

The first housing 201 may be referred to as a first structure, a slide unit, or a slide housing, and may be disposed to be reciprocable on the second housing 202. The first housing 201 may accommodate various components such as a circuit board and a battery.

The second housing 202 may be referred to as a second structure, a main part, or a main housing. A portion of the display 203 (e.g., a first display area A1) may be disposed on the first housing 201.

When the first housing 201 moves (e.g., slides) relative to the second housing 202, at least a part of another portion of the display 203 (e.g., a second display area A2) may be accommodated inside the second housing 202 (e.g., a slide-in operation) or visually exposed to the outside of the second housing 202 (e.g., a slide-out operation).

The first housing 201 includes a first support member 211 (e.g., a slide plate). The first support member 211 may include a first surface F1 providing at least a portion of the first support member 211 and a second surface F2 facing away from the first surface F1. The first support member 211 may support at least a portion of the display 203 (e.g., the first display area A1).

The second housing 202 may include a second support member 221 (e.g., a main case). The second support member 221 may accommodate the first support member 211 of the first housing 201. For example, the second support member 221 may include a second side member 221b, a third side member 221c substantially parallel to the second side member 221b, and a first side member 221a perpendicular to the second side member 221b and the third side member 221c. The second support member 221 may have a shape that is open shape at one side (e.g., the front surface) to accommodate (or surround) at least a portion of the first housing 201. For example, the first housing 201 is accommodated in the second housing 202 while being at least partially surrounded and is slidable in a direction parallel to the first surface F1 or the second surface F2 (e.g., the direction indicated by arrow ①) while being guided by the second housing 202. The second support member 221, the first side member 221a, the second side member 221b, and/or the third side member 221c may be integrated with each other or may be configured as separate housings to be coupled to or assembled with each other.

The second housing 202 may include a rear plate 223. The rear plate 223 may substantially define at least a portion of the exterior of the second housing 202 or the electronic device 200. For example, the rear plate 223 may be coupled to the outer surface of the second support member 221. The rear plate 223 may be integrated with the second support member 221. The rear plate 223 may provide a decorative effect at the exterior of the electronic device 200. The second support member 221 may be manufactured using at least one of a metal or a polymer, and the rear plate 223 may be manufactured using at least one of a metal, glass, a synthetic resin, or ceramic. The second support member 221 and/or the rear plate 223 may be made of a material that at least partially transmits light (e.g., an auxiliary display area). For example, while a portion of the display 203 (e.g., the second display area A2) is accommodated in the electronic device 200, the electronic device 200 may output visual information using the second display area A2. The auxiliary display area may be a portion of the second support member 221 and/or the rear plate 223 in which the display 203 accommodated inside the second housing 202 is located.

The second housing 202 may cover at least a portion of the display 203. For example, at least a portion of the display 203 may be accommodated inside the second housing 202, and a portion of the second support member 221 (e.g., the first side member 221a) may cover a portion of the display 203 accommodated inside the second housing 202.

The electronic device 200 also may include a display 203, a key input device 241, a connector hole 243, audio modules 247a, 247b, and 247c, and camera modules 249a and 249b.

Although not illustrated in FIGS. 2 and 3, the electronic device 200 may further include an indicator (e.g., a light emitting diode (LED) device) or various sensor modules.

The display 203 may include a first display area A1 and a second display area A2. The first display area A1 may be disposed on the first housing 201. For example, the first display area A1 may extend substantially across at least a portion of the first surface F1 and may be disposed on the first surface F1. The second display area A2 may extend from the first display area A1, and according to the sliding movement of the first housing 201, the second display area A2 may be inserted into or accommodated in the second housing 202 or may be visually exposed to the outside of the second housing 202.

At least a portion of the second display area A2 may move while being substantially guided by a display support member to be accommodated inside the second housing or a space defined between the first housing 201 and the second housing 202 or to be visually exposed to the outside. The second display area A2 may be moved based on the slide movement of the first housing 201 in the first direction (e.g., the direction indicated by arrow ①). For example, a portion of the second display area A2 may be deformed into a curved shape while the first housing 201 slides.

When viewed from above the first support member 211 (e.g., the slide plate), if the first housing 201 moves from the closed state to the open state, the second display area A2 may define a substantially flat surface with the first display area A1 while being gradually visually exposed to the outside of the second structure 202. The display 203 may be coupled to or disposed adjacent to a touch detection circuit, a pressure sensor capable of measuring touch intensity (pressure), and/or a digitizer configured to detect a magnetic-field-type stylus pen. The second display area A2 may be at least partially accommodated inside the second housing 202, and even in the closed state illustrated in FIG. 2, a portion of the second display area A2 may be visually exposed to the outside.

The key input device 241 may be located in an area of the first housing 201. Depending on the external appearance and use state, the electronic device 200 may be designed such that the illustrated key input devices 241 are omitted or an additional key input device(s) is(are) included. The electronic device 200 may include a key input device, such as a home key button or a touch pad disposed around the home key button. At least some of the key input devices 241 may be disposed on the first side member 221a, the second side member 221b and/or the third side member 221c of the second housing 202.

The connector hole 243 may be omitted depending on an embodiment, and may accommodate a connector (e.g., a USB connector) for transmitting and receiving power and/or data to and from an external electronic device. The electronic device 200 may include a plurality of connector holes 243, and some of the connector holes 243 may function as connector holes for transmitting and receiving audio signals to and from an external electronic device. In FIGS. 2 and 3, the connector hole 243 is disposed in the third side member 221c, but the disclosure is not limited thereto. The connector hole 243 or a connector hole may be disposed in the first side member 221a or the second side member 221b.

The audio modules 247a, 247b, and 247c may include at least one speaker hole 247a, at least one microphone hole 247b, or at least one duct 247c. One speaker hole 247a may be provided as a receiver hole for a voice call, and another one may be provided as an external speaker hole. The electronic device 200 may include a microphone configured to acquire sound, and the microphone may acquire sound outside the electronic device 200 through the microphone hole 247b. The electronic device 200 may guide a part of the energy of low-pitched sound generated by the speaker (e.g., the sound output module 155 in FIG. 1) to the outside of the electronic device 200 using the duct 247c. The electronic device 200 may include a plurality of microphones to detect the direction of sound. The electronic device 200 may include an audio module in which the speaker hole 247a and the microphone hole 247b are implemented as a single hole, or a speaker in which the speaker hole 247a is excluded (e.g., a piezo speaker).

The camera modules 249a and 249b may include a first camera module 249a and a second camera module 249b. The second camera module 249b may be located in the first housing 201 and may photograph a subject in a direction opposite to the first display area A1 of the display 203. The electronic device 200 may include a plurality of camera modules. For example, the electronic device 200 may include at least one of a wide-angle camera, a telephoto camera, and a close-up camera. The electronic device 200 may include an IR projector and/or an IR receiver to measure the distance to the subject. The camera modules 249a and 249b may include one or more lenses, an image sensor, and/or an ISP. The electronic device 200 may further include another camera module, for example, the first camera module 249a (e.g., a front camera), for photographing a subject in a different direction from that of the second camera module 249b. For example, the first camera module 249a may be disposed around the first display area A1 or in an area overlapping the display 203, and when disposed in the area overlapping the display 203, the first camera module 249a may photograph a subject through the display 203.

An indicator of the electronic device 200 may be disposed on the first housing 201 or the second housing 202, and may provide state information of the electronic device 200 as a visual signal by including a light-emitting diode. A sensor module of the electronic device 200 may generate an electrical signal or a data value corresponding to an internal operating state of the electronic device 200 or an external environmental state. The sensor module may include, for example, a proximity sensor, a fingerprint sensor, or a biometric sensor (e.g., an iris/face recognition sensor or a heart rate monitor (HRM) sensor). The sensor module may also include at least one of a gesture sensor, a gyro sensor, an atmospheric pressure sensor, a magnetic sensor, an acceleration sensor, a grip sensor, a color sensor, an IR sensor, a temperature sensor, a humidity sensor, or an illuminance sensor.

Figure 4:
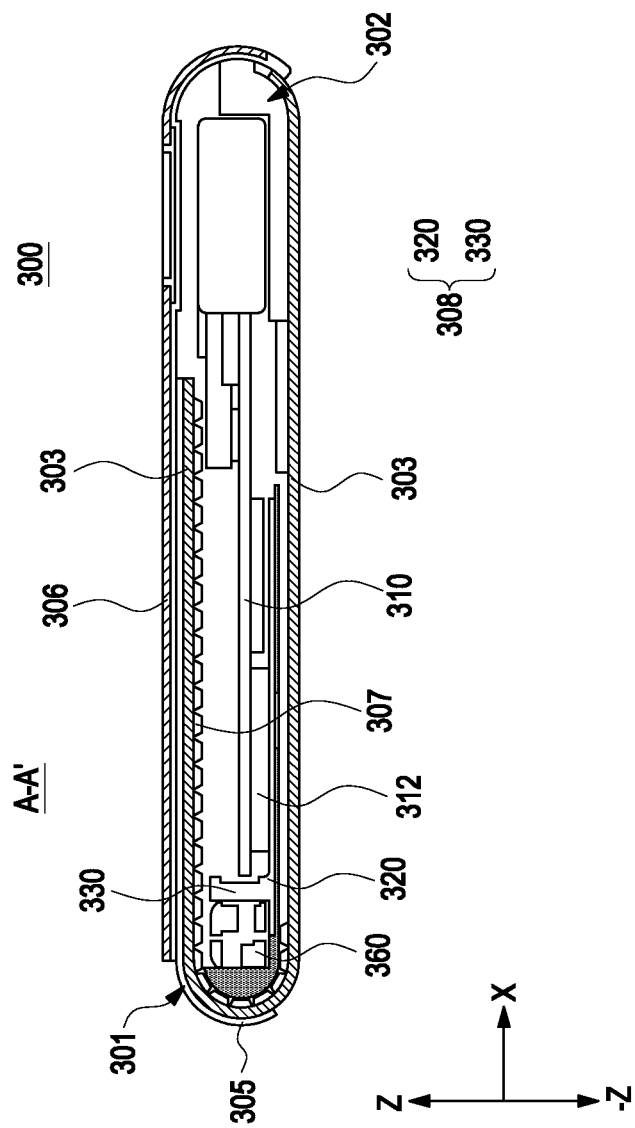
FIG. 4 illustrates a cross-sectional view taken along plane A-A' in FIG. 2.

FIG. 4 illustrates a cross-sectional view taken along plane A-A' in FIG. 2. FIG. illustrates a cross-sectional view taken along plane B-B' of FIG. 3.

Figure 5:
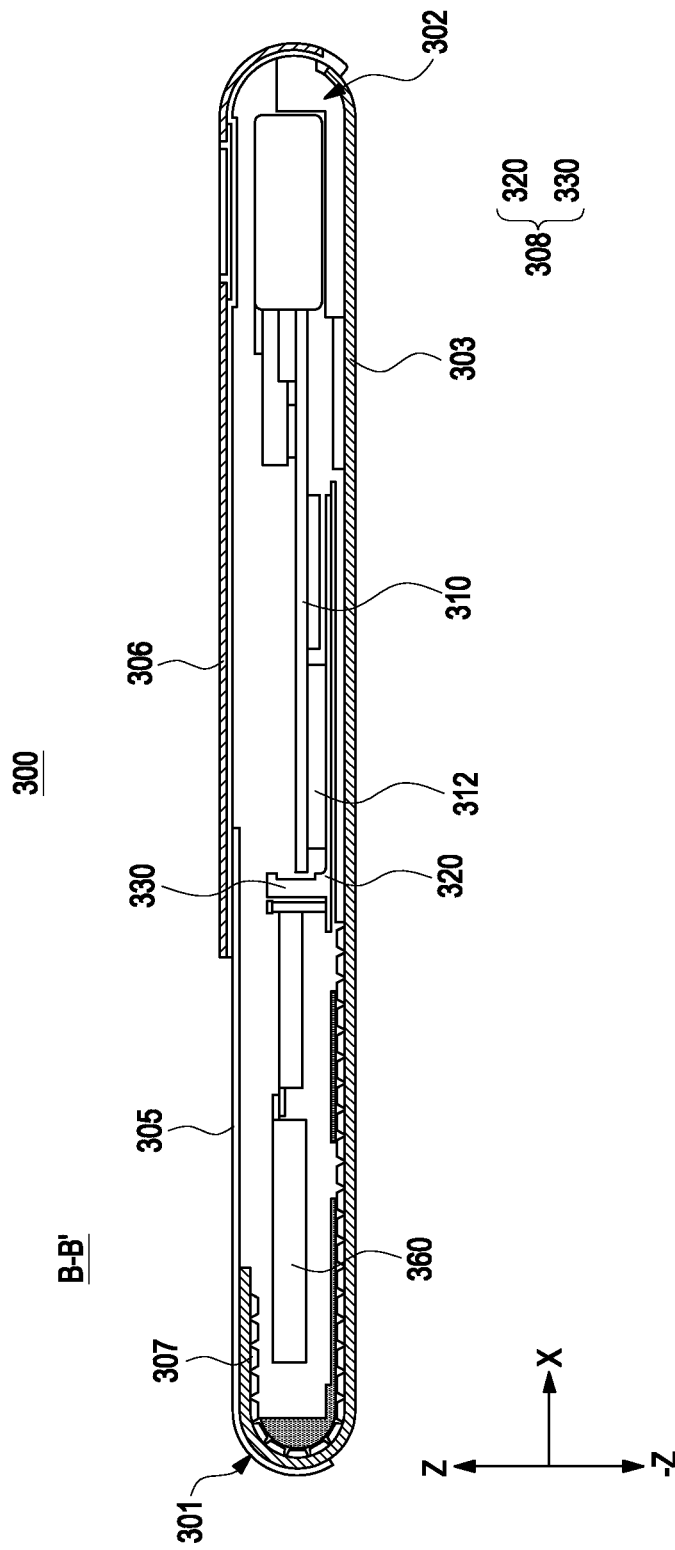
FIG. 5 illustrates a cross-sectional view taken along plane B-B' of FIG. 3.

Referring to FIGS. 4 and 5, the electronic device 300 may include a first housing 301, a second housing 302, and a display 303 (e.g., a flexible display, a foldable display, or a rollable display).

The electronic device 300 may be changed to a closed state (e.g., FIG. 4) or an open state (e.g., FIG. 5) based on the sliding movement of the first housing 301.

The electronic device 300 includes a first rear plate 305. The first rear plate 305 may define at least a portion of the outer surface of the electronic device 300. For example, the first rear plate 305 may define a second surface F2. The first rear plate 305 may be connected to the first housing 301, and may slide together with the first housing 301 relative to the second housing 302. The configuration of the first rear plate 305 may be the same in whole or in part as that of the first support member 211 of FIG. 3.

The electronic device 300 may include a second rear plate 306. The second rear plate 306 may be connected to the second housing 302. The configuration of the second rear plate 306 may be the same in whole or in part as that of the rear plate 223 of FIGS. 2 and 3.

The electronic device 300 includes a display support member 307. At least a portion of the display support member 307 may be a multi-joint hinge structure or a multi-bar assembly. For example, at least a portion of the display support member 307 may be bent to correspond to the display 303 according to the sliding movement of the first housing 301. The display support member 307 may be connected to the display 303 and/or the first housing 301. For example, as the first housing 301 slides, the display support member 307 may move relative to the second housing 302. The display support member 307 may be substantially accommodated in the second housing 302 in the closed state (e.g., FIG. 2). The display support member 307 may be disposed under the display 303.

The electronic device 300 may include a PCB 310 on which at least one electronic component 312 is mounted. The PCB 310 may be disposed in the housings 301 and 302. For example, the PCB 310 may be disposed on the support structure 308 located within the second housing 302. The configuration of the electronic component 312 may be the same in whole or in part as that of the processor 120 or the memory 130 of FIG. 1.

The electronic device 300 may include the support structure 308. The support structure 308 may be disposed in the housings 301 and 302. For example, the support structure 308 may be located within and coupled to the second housing 302. When the first housing 301 slides relative to the second housing 302, the distance between the first housing 301 and the support structure 308 may increase. The support structure 308 may support a component (e.g., the PCB 310) of the electronic device 300.

The support structure 308 may include a support member 320 that may accommodate or support the PCB 310.

The support structure 308 may include a side wall member 330. The side wall member 330 may be disposed between at least a portion of the first housing 301 and at least a portion of the second housing 302. For example, the side wall member 330 may not be exposed to the outside of the electronic device 300 and may not come into direct contact with the user. The first housing 301 may be connected to the hinge module 360 connected to the side wall member 330, and may slide relative to the side wall member 330. The side wall member 330 may face at least a portion of the first housing 301 and at least a portion of the second housing 302. The side wall member 330 may be connected to the support member 320. For example, the side wall member 330 may be a separate component disposed on the support member 320. The side wall member 330 may be integrated with the support member 320. For example, the side member 330 may be interpreted as a portion extending from the support member 320 of the support structure 308 toward the second rear plate 306. The support structure 308 may be formed of a metal. For example, the support structure 308 may include at least one of aluminum or stainless steel.

The electronic device 300 may include at least one hinge module 360. The hinge module 360 may connect the first housing 301 and the second housing 302 to one another. For example, the hinge module 360 may be connected to the first housing 301 and the side wall member 330. The side wall member 330 may be at least a portion of the support structure 308 disposed in the second housing 302.

The hinge module 360 may guide the sliding movement of the first housing 301. For example, the hinge module 360 may guide the slide movement of the first housing 301 in the first direction (e.g., the X-axis direction) by rotating about a rotation axis in the second direction (e.g., the Z-axis direction).

Additionally, the configuration for guiding the sliding movement of the first housing 301 is not limited to the hinge module 360. For example, the electronic device 300 may include a link structure connected to the first housing 301 and/or the second housing 302, a gear structure (e.g., a rack gear and/or a spur gear), a pulley structure, and/or a motor. The link structure and/or the gear may guide the sliding movement of the first housing 301. The motor generates a driving force for the sliding movement of the first housing 301 and/or the second housing 302, and the first housing 301 and/or the second housing 302 may be slid using the gear structure or the pulley structure.

Figure 6:
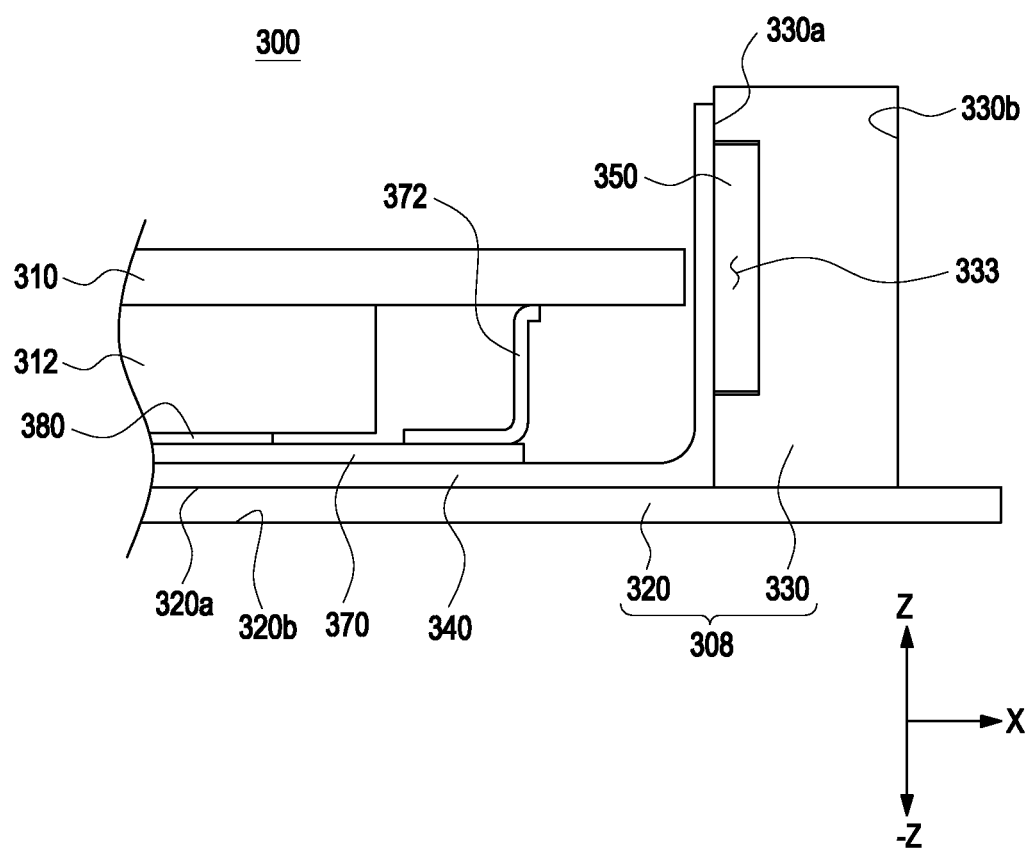
FIG. 6 illustrates a cross-sectional view of an electronic device according to an embodiment.
Figure 7:
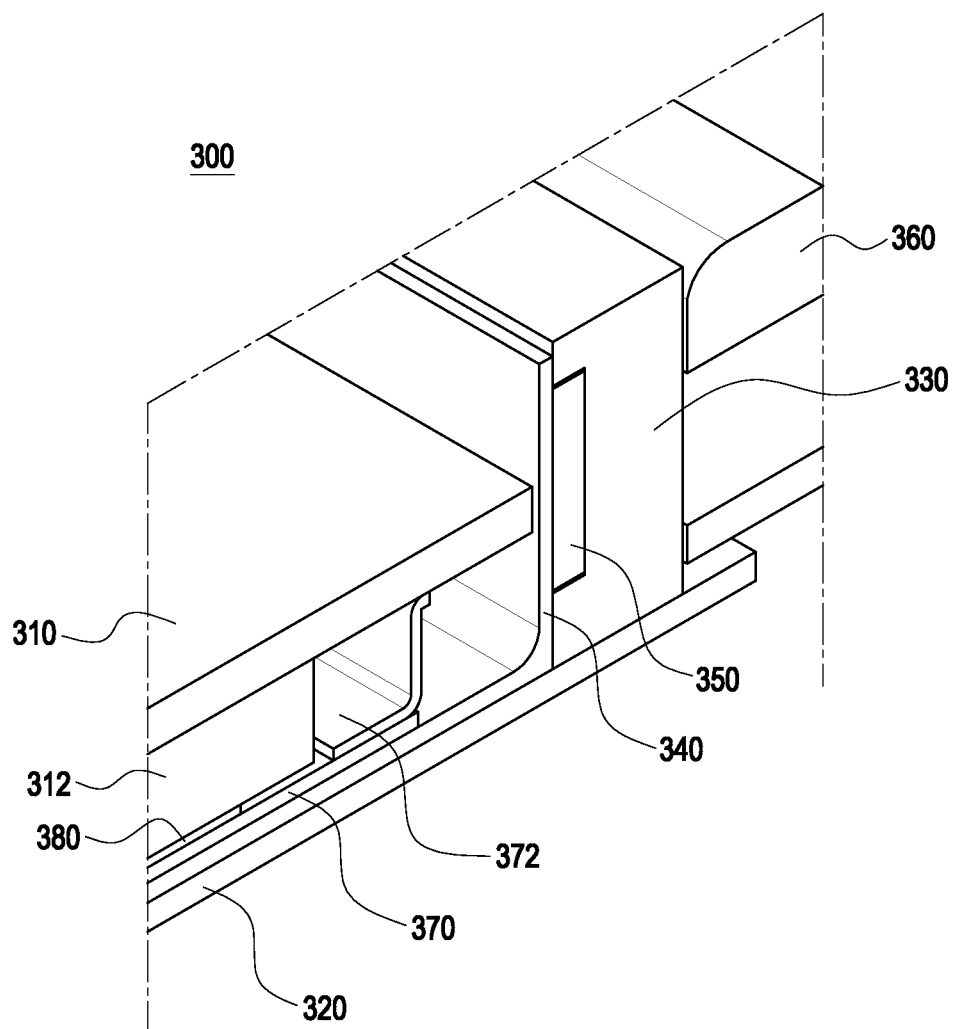
FIG. 7 illustrates a cross-sectional view of an electronic device according to an embodiment.

FIG. 6 illustrates a cross-sectional view of an electronic device according to an embodiment. FIG. 7 illustrates a cross-sectional view of an electronic device according to an embodiment.

Referring to FIGS. 6 and 7, the electronic device 300 may include a PCB 310, a support member 320, a side wall member 330, a heat dissipation sheet 340, a heat dissipation member 350, a hinge module 360, a shielding member 370, and/or a first heat dissipation adhesive member 380.

The configurations of the electronic device 300, the PCB 310, the electronic component 312, the support member 320, the side wall member 330, and/or the hinge module 360 of FIGS. 6 and 7 may be the same in whole or in part as those of the electronic device 300, the PCB 310, the electronic component 312, the support member 320, the side wall member 330, and/or the hinge module 360 of FIGS. 4 and 5.

At least a portion of the support member 320 may face the PCB 310 and/or the electronic component 312. For example, the support member 320 may include a second support member surface 320b, which faces at least a portion of a display (e.g., the display 303 in FIG. 4), and a first support member surface 320a, which is opposite to the second support member surface 320b and faces at least a portion of the PCB 310 and/or the electronic component 312.

The side wall member 330 may face at least a portion of the PCB 310 and/or the electronic component 312. For example, the side wall member 330 may include a first side wall member surface 330a facing at least a portion of the PCB 310 and/or the electronic component 312, and a second side wall member surface 330b, which is opposite to the first side wall member surface 330a and faces at least a portion of the hinge module 360. The side wall member 330 may transfer at least a part of heat to the heat dissipation sheet 340. For example, at least a portion of the side wall member 330 may face at least a portion of the heat dissipation sheet 340. The side wall member 330 may be integrated with the support member 320. For example, the side wall member 330 and the support member 320 may be interpreted as one component.

The heat dissipation sheet 340 may diffuse heat generated by the electronic component 312 to other components of the electronic device 300. At least a portion of the heat dissipation sheet 340 may be connected to the electronic component 312. For example, the heat dissipation sheet 340 may receive at least part of the heat generated by the electronic component 312 via the shielding member 370 and/or the first heat dissipation adhesive member 380 and may transfer at least a part of the received heat to other components (e.g., the support member 320 and/or the side wall member 330). The heat dissipation sheet 340 may include a material having high thermal conductivity (e.g., copper (Cu) and/or graphite).

The heat dissipation sheet 340 may face the PCB 310 and/or the electronic component 312 and may transfer at least a part of the heat transferred from the electronic component 312 to the side wall member 330. The heat dissipation sheet 340 may be disposed on the support member 320 and the side wall member 330. For example, the heat dissipation sheet 340 may extend from the first support member surface 320a of the support member 320 to the first side wall member surface 330a of the side wall member 330. Alternatively, the heat dissipation sheet 340 may include a plurality of heat dissipation sheets, which are disposed on the first support member surface 320a of the support member 320 and the first side wall member surface 330a of the side wall member 330.

The heat dissipation member 350 may receive heat from the heat dissipation sheet 340. The heat dissipation member 350 may face at least a portion of the heat dissipation sheet 340. For example, the heat dissipation member 350 may be in contact with the heat dissipation sheet 340, and at least a part of heat generated by the electronic component 312 may be transferred to the heat dissipation member 350 via the heat dissipation sheet 340. At least a portion of the heat dissipation member 350 may be disposed substantially parallel to the first side wall member surface 330a of the side wall member 330. The heat dissipation member 350 may be disposed on the side wall member 330. For example, the side wall member 330 may include an accommodation groove 333, and the heat dissipation member 350 may be disposed in the accommodation groove 333. The heat dissipation member 350 may be a heat pipe. For example, the heat dissipation member 350 may include a volatile fluid (e.g., water, methanol, or acetone) and a case that accommodates the volatile fluid. The case may include at least one of copper, stainless steel, ceramic or tungsten. The heat dissipation member 350 may include copper.

Alternatively, the heat dissipation member 350 may be omitted. For example, at least a part of heat generated by the electronic component 312 may be transferred to the side wall member 330 via the heat dissipation sheet 340.

The shielding member 370 may reduce electromagnetic waves generated by the electronic component 312 and transmitted to the outside of the electronic device 300. The shielding member 370 may be disposed on the heat dissipation sheet 340. For example, the shielding member 370 may be disposed between the electronic component 312 and the heat dissipation sheet 340. The shielding member 370 may include at least one shielding structure 372 surrounding at least a portion of the electronic component 312. The shielding member 370 may cover an upper portion of the electronic component 312, and the shielding structure 372 may cover the side surface of the electronic component 312.

The first heat dissipation adhesive member 380 may increase the proportion at which heat generated by the electronic component 312 is transferred to the heat dissipation sheet 340 and/or the heat dissipation member 350. The first heat dissipation adhesive member 380 may include a thermal interface material (TIM). For example, the first heat dissipation adhesive member 380 may be made of a thermally conductive material having an adhesive property (e.g., a thermal paste, a thermal gap filler, a thermal adhesive, or a thermal tape). The first heat dissipation adhesive member 380 may be disposed on the shielding member 370 (e.g., in the Z direction of FIG. 6). For example, the first heat dissipation adhesive member 380 may be disposed between the electronic component 312 and the shielding member 370.

Figure 8:
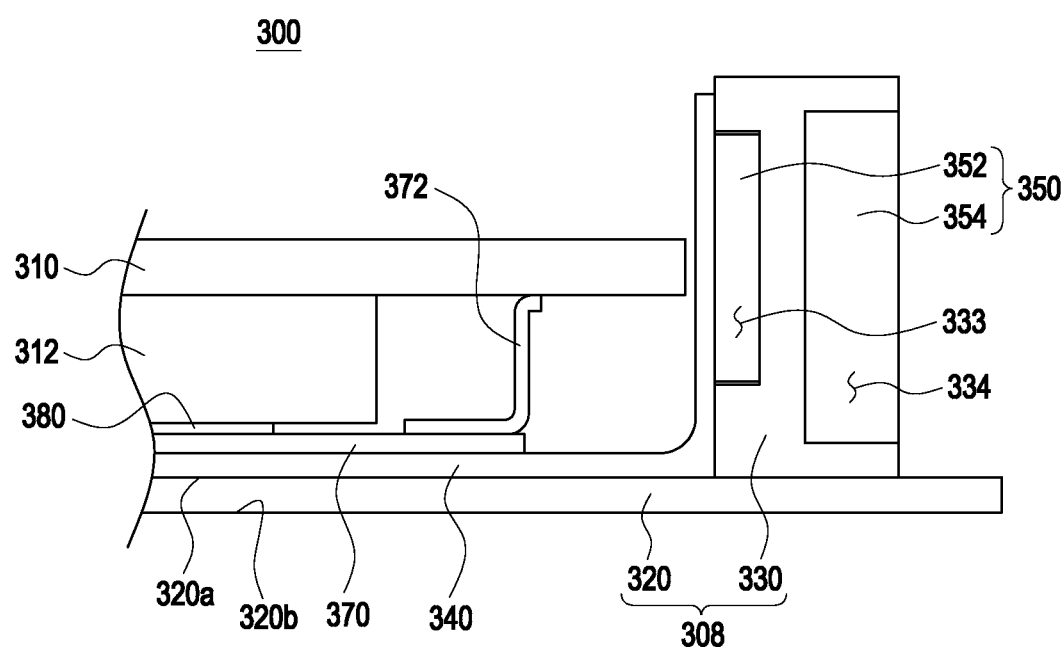
FIG. 8 illustrates a cross-sectional view of an electronic device according to an embodiment.
Figure 9:
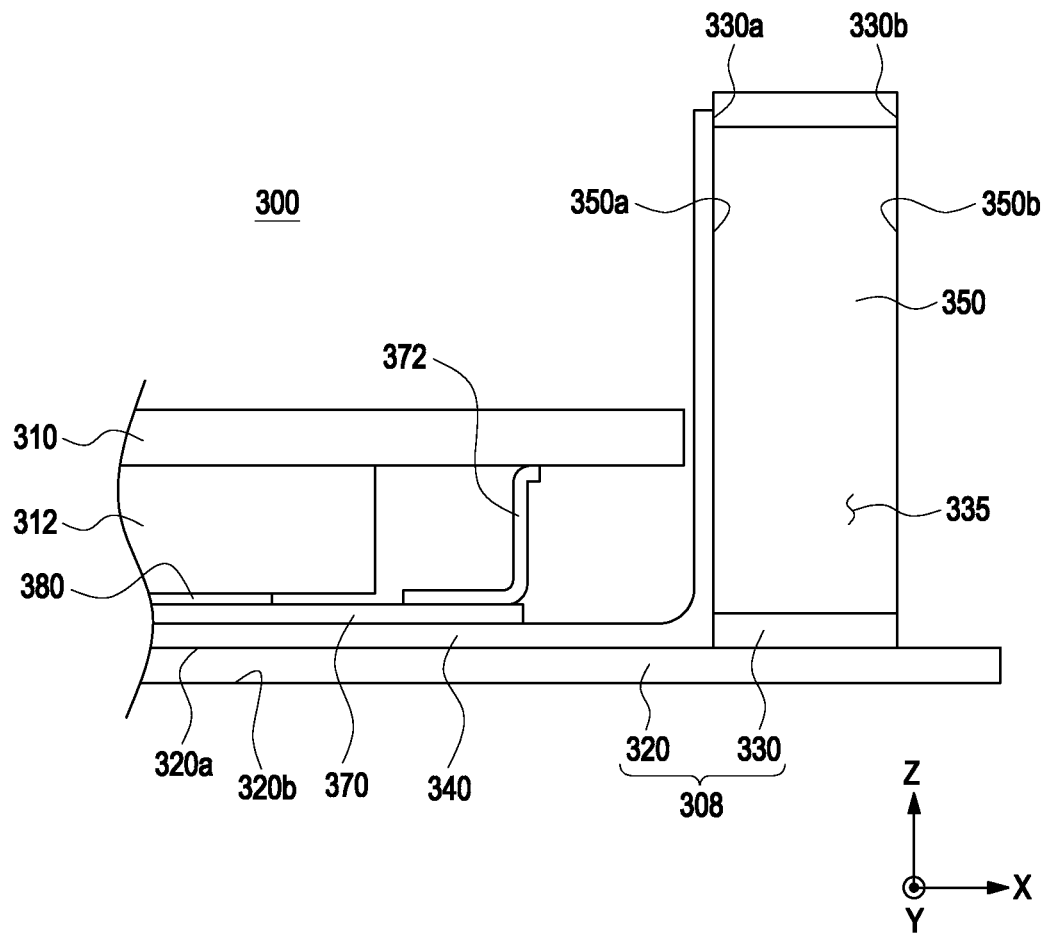
FIG. 9 illustrates a cross-sectional view of an electronic device according to an embodiment.

FIG. 8 illustrates a cross-sectional view of an electronic device according to an embodiment. FIG. 9 illustrates a cross-sectional view of an electronic device according to an embodiment.

Referring to FIGS. 8 and 9, the heat dissipation member 350 may include at least one heat dissipation member 350 connected to the side wall member 330. The configurations of the electronic device 300, the PCB 310, the electronic component 312, the support member 320, the side wall member 330, the heat dissipation sheet 340, the heat dissipation member 350, the shielding member 370, and the first heat dissipation adhesive member 380 of FIGS. 8 and 9 may be the same in whole or in part as those of the electronic device 300, the PCB 310, the electronic component 312, the support member 320, the side wall member 330, the heat dissipation sheet 340, the heat dissipation member 350, the shielding member 370, and the first heat dissipation adhesive member 380 of FIGS. 6 and 7.

In FIG. 8, the side wall member 330 includes a plurality of accommodation grooves 333 and 334. At least one first accommodation groove 333 facing the heat dissipation sheet 340 and a second accommodation groove 334 facing a hinge module 360 may be included. The first accommodation groove 333 and the second accommodation groove 334 may accommodate the heat dissipation member 350.

The heat dissipation member 350 includes a first heat dissipation member 352 facing the heat dissipation sheet 340 and a second heat dissipation member 354 spaced apart from the first heat dissipation member 352 and facing the hinge module 360. For example, the heat dissipation member 350 may include a first heat dissipation member 352 disposed in the first accommodation groove 333 and a second heat dissipation member 354 disposed in the second accommodation groove 334. The first heat dissipation member 352 may be disposed substantially parallel to the second heat dissipation member 354.

Figure 17:
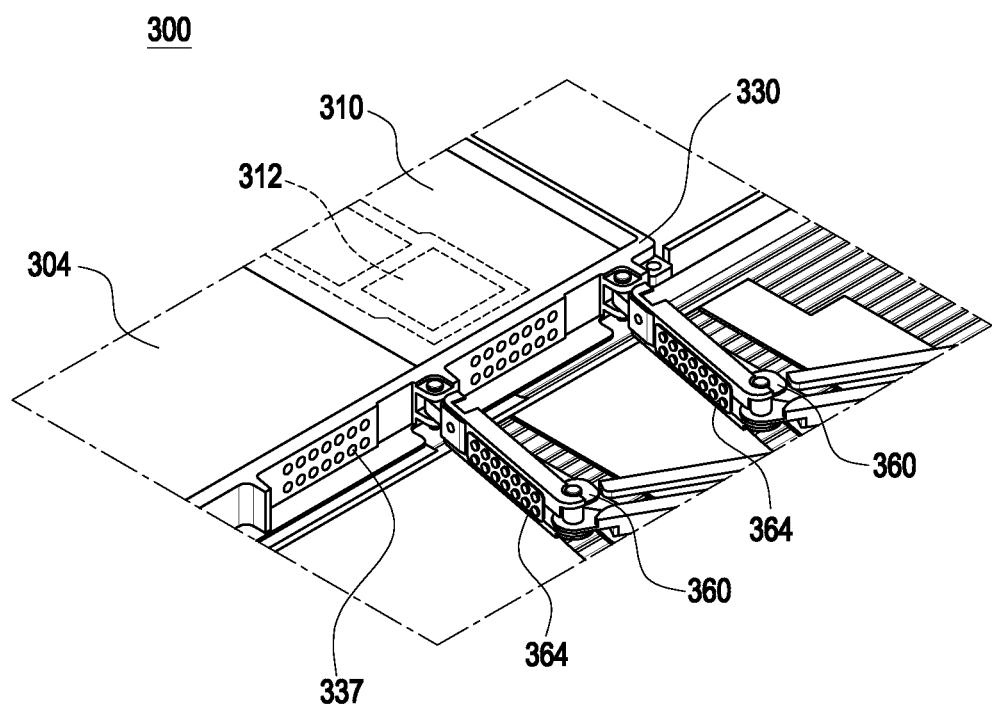
FIG. 17 illustrates an electronic device including a hinge module including a protrusion structure according to an embodiment.

In FIG. 9, the side wall member 330 includes at least one through hole 335 (e.g., the through hole 337 in FIG. 17). The through hole 335 may be a hole penetrating the space between the first side wall member surface 330a and the second side wall member surface 330b of the side wall member 330. The side wall member 330 may include a plurality of through holes 335 spaced apart from each other in a longitudinal direction (e.g., the Y-axis direction) of the electronic device 300. For example, the through holes 335 may be provided as a plurality of through holes. The side wall member 330 may include a plurality of through holes 335 spaced apart from each other in the widthwise direction (e.g., the Z-axis direction) of the electronic device 300. For example, the through holes 335 may be arranged in at least one row and at least one column.

The heat dissipation member 350 may be disposed in the through hole 335. The heat dissipation member 350 may face the PCB 310 and the hinge module (e.g., the hinge module 360 in FIG. 7). For example, the heat dissipation member 350 may include a first heat dissipation member surface 350a facing the PCB 310 and/or the electronic component 312 and a second heat dissipation member surface 350b, which is opposite to the first heat dissipation member surface 350a and faces the hinge module. The heat dissipation member 350 may include a plurality of heat dissipation members 350 spaced apart from each other in the longitudinal direction of the electronic device 300 (e.g., the Y-axis direction). The heat dissipation member 350 may receive at least a part of heat generated by the electronic component 312 via the heat dissipation sheet 340. For example, at least a portion of the first heat dissipation member surface 350a of the heat dissipation member 350 faces at least a portion of the heat dissipation sheet 340, and at least a part of the heat generated by the electronic component 312 may be transferred to the second heat dissipation member surface 350b via the heat dissipation sheet 340 and the first heat dissipation member surface 350a.

Figure 10:
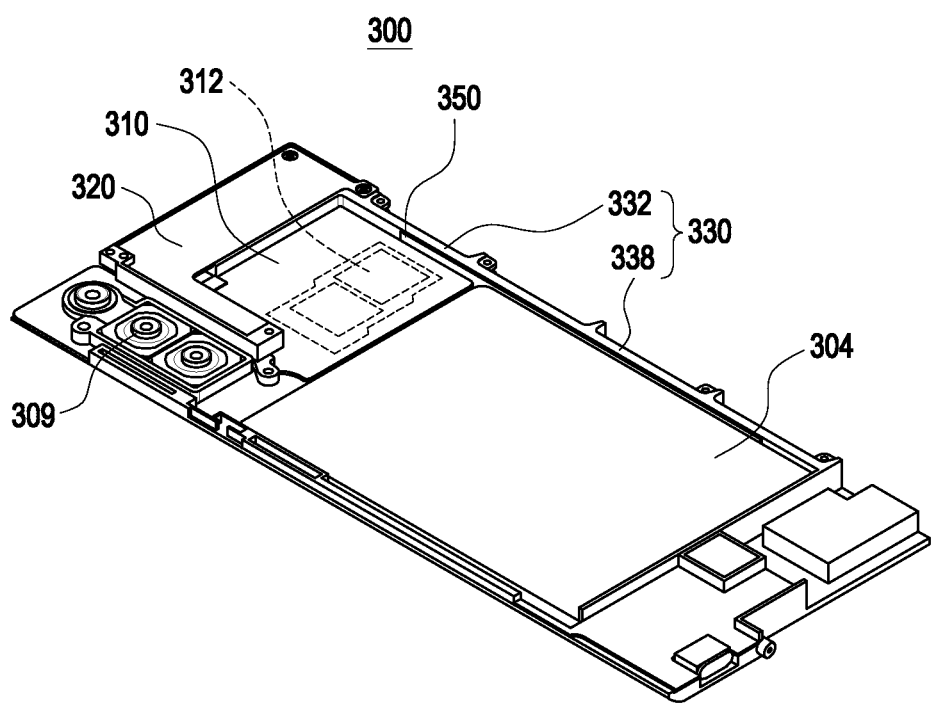
FIG. 10 illustrates an electronic device including a heat dissipation member facing a battery, according to an embodiment.

FIG. 10 illustrates an electronic device including a heat dissipation member facing a battery, according to an embodiment.

Referring to FIG. 10, the electronic device 300 may include a heat dissipation member 350 at least partially facing the PCB 310 and the battery 304. The configurations of the electronic device 300, the printed circuit board 310, the electronic component 312, the support member 320, the side surface member 330, and the heat dissipation member 350 in FIG. 10 may be the same in whole or in part as those of the electronic device 300, the printed circuit board 310, the electronic component 312, the support member 320, the side surface member 330, and the heat dissipation member 350 in FIGS. 6 to 9.

The electronic device 300 may include the battery 304 disposed on the support member 320. At least a portion of the battery 304 may face the side member 330. The battery 304 may be disposed in a housing (e.g., the second housing 202 in FIG. 3). The configuration of the battery 304 may be the same in whole or in part as that of the battery 189 of FIG. 1.

The support member 320 may support at least some of the components of the electronic device 300. For example, the support member 320 may support a camera module 309 (e.g., the second camera module 249b in FIG. 3), a PCB 310 on which an electronic component 312 is mounted, and a battery 304. Some of heat generated by the electronic component 312 mounted on the PCB 310 may be transferred to the battery 304 via the support member 320.

The side wall member 330 may face the PCB 310 and the battery 304. For example, the side wall member 330 may include a first side wall area 332 facing at least a portion of the PCB 310 and a second side wall area 338 extending from the first side wall area 332 and facing the battery 304. At least some of heat generated by the electronic component 312 may be transferred to the second side wall area 338 via the first side wall area 332.

The heat dissipation member 350 may diffuse at least a part of heat generated by the electronic component 312. The heat dissipation member 350 may be disposed on the first side wall area 332 and the second side wall area 338. For example, at least some of the heat generated by the electronic component 312 may be transferred to the second side wall area 338 via the heat dissipation sheet (e.g., the heat dissipation sheet 340 in FIG. 6) and the heat dissipation member 350, and an area through which heat is diffused may be increased.

Figure 11:
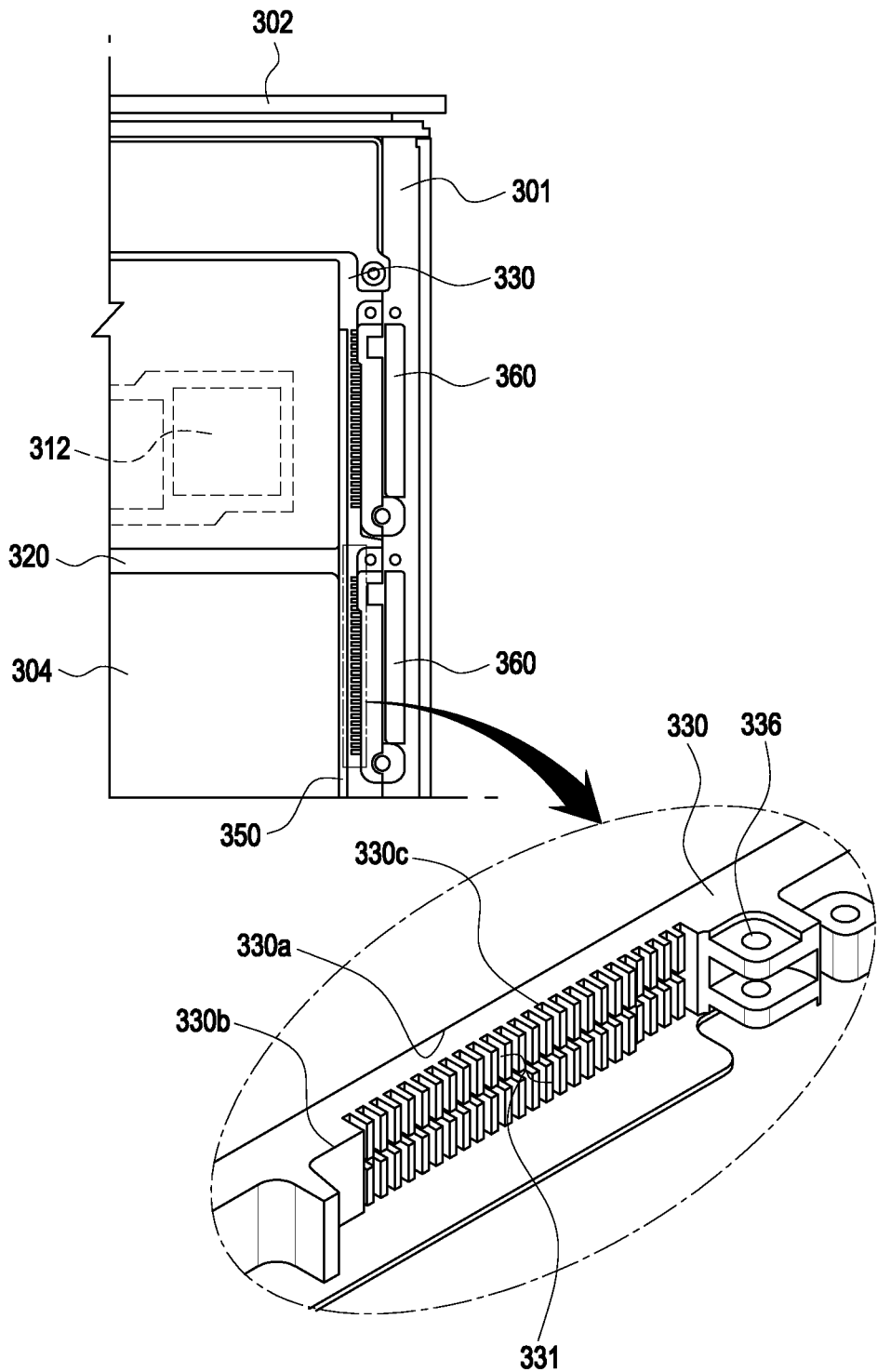
FIG. 11 illustrates an electronic device including a fin structure, according to an embodiment.
Figure 12:
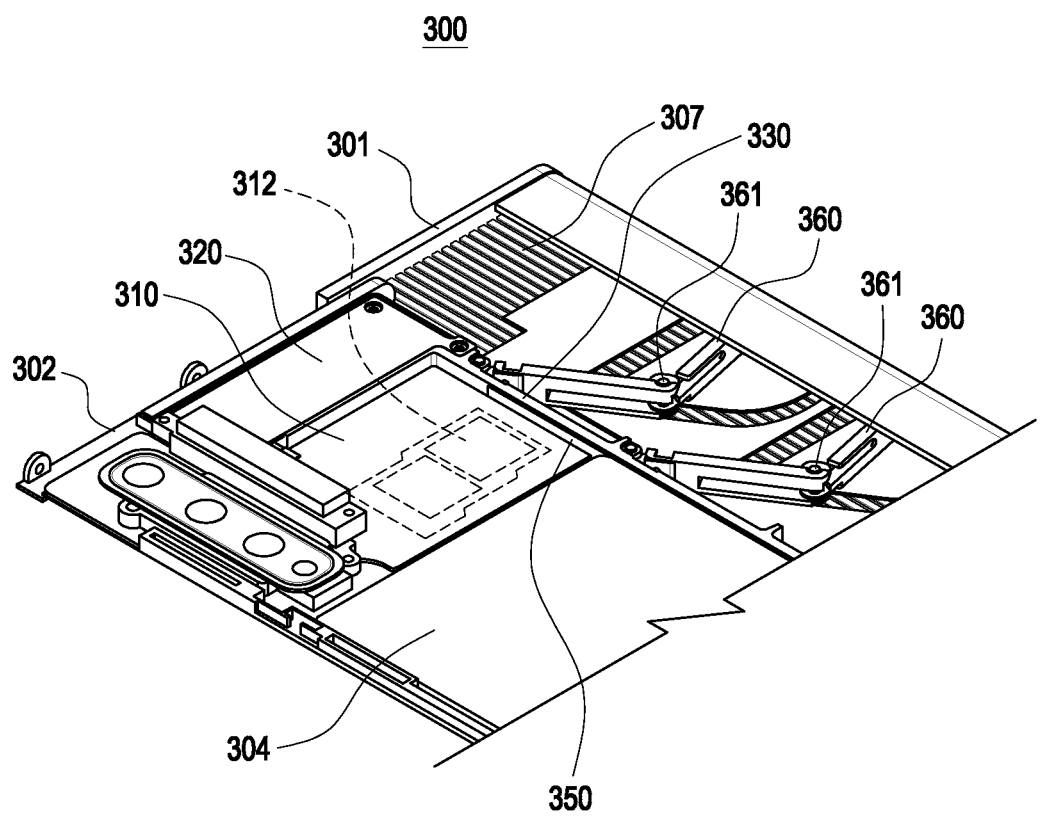
FIG. 12 illustrates an electronic device, from which a rear plate is excluded, according to an embodiment.
Figure 13:
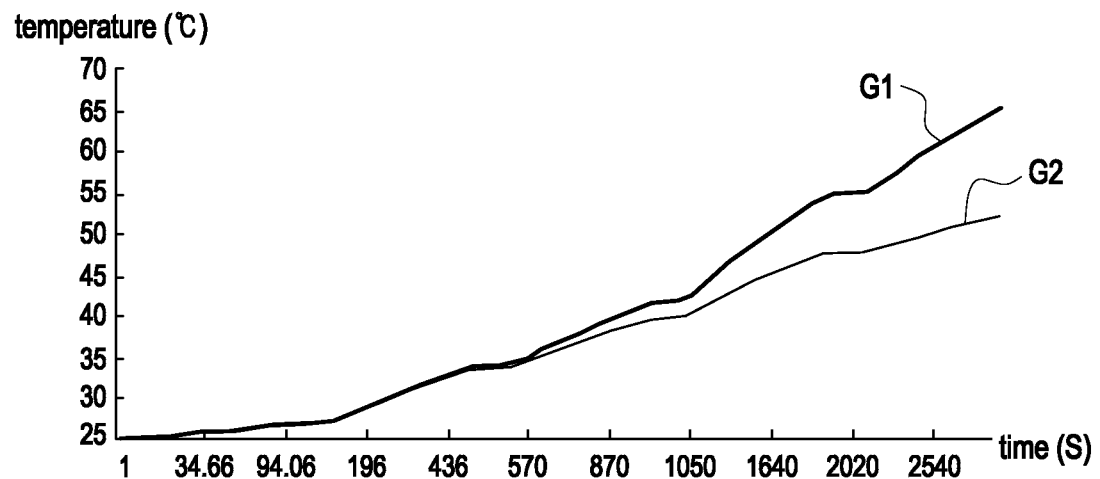
FIG. 13 illustrates a graph for a temperature of an electronic component depending on an operation time of a component, according to an embodiment.

FIG. 11 illustrates an electronic device including a fin structure, according to an embodiment. FIG. 12 illustrates an electronic device, from which a rear plate is excluded, according to an embodiment. FIG. 13 illustrates a graph of a temperature of an electronic component depending on an operation time of the component, according to an embodiment.

Referring to FIGS. 11 to 13, at least some of the heat generated by the electronic component 312 may be diffused using the side wall member 330. The configurations of the first housing 301, the second housing 302, the battery 304, the display support member 307, the PCB 310, the electronic component 312, the support member 320, the side wall member 330, the heat dissipation member 350, and the hinge module 360 of FIG. 11 and/or FIG. 12 may be the same in whole or in part as those of the first housing 301, the second housing 302, the battery 304, the display support member 307, the PCB 310, the electronic component 312, the support member 320, the side wall member 330, the heat dissipation member 350, and the hinge module 360 of FIG. 4, FIG. 5, FIG. 6, and/or FIG. 10.

The side wall member 330 may include at least one fin structure 331. The fin structure 331 may be a heat sink through which heat received by the side wall member 330 is dissipated. For example, the fin structure 331 is configured to increase the cross-sectional area of the side wall member 330, and at least some of heat transferred from the heat dissipation member 350 to the side wall member 330 may be transferred to the outside of the side wall member 330 via the fin structure 331. The pin structure 331 may face or be in contact with the hinge module 360. For example, while the electronic device 300 is closed (e.g., as illustrated in FIG. 11), the fin structure 331 is disposed adjacent to the hinge module 360, and at least some of heat generated by the electronic component 312 may be transferred to the hinge module 360 via the pin structure 331 of the side wall member 330.

The fin structure 331 may dissipate at least a part of heat generated by the electronic component 312. The temperature G2 of the electronic device 300 including the fin structure 331 may be lower than the temperature G1 of an electronic device not including the fin structure 331. The temperature of the electronic device 300 may be interpreted as a temperature of an area in which the electronic component 312 is located. For example, when the electronic component 312 is operated, the electronic component 312 generates heat, and the generated heat may be transferred to the side wall member 330 via a heat dissipation sheet (e.g., the heat dissipation sheet 340 in FIG. 6), and/or a heat dissipation member (e.g., the heat dissipation member 350 in FIG. 6). The heat transferred to the side wall member 330 may be transferred to another component of the electronic device 300 (e.g., the hinge module 360) or to the outside of the electronic device 300 via the fin structure 331, and the temperature of the electronic component 312 may be reduced.

The side wall member 330 may be located between the PCB 310 and the hinge module 360. For example, the side wall member 330 may include a first side wall member surface 330a facing at least a portion of the PCB 310 and/or at least a portion of a heat dissipation sheet (e.g., the heat dissipation sheet 340 in FIG. 7), and a second side wall member surface 330b, which is opposite to the first side wall member surface 330a and faces at least a portion of the hinge module 360. The side wall member 330 may include a third side wall member surface 330c defining at least a portion of a groove formed in the second side wall member surface 330b. The fin structure 331 may be formed to protrude from the third side wall member surface 330c.

The side wall member 330 may be connected to the hinge module 360. For example, the side wall member 330 may include a connection structure 336 configured to accommodate the hinge module 360. The connection structure 336 may extend from the second side wall member surface 330b.

The hinge module 360 may be connected to the first housing 301 and the side wall member 330. While being connected to the first housing 301 and the side wall member 330, the hinge module 360 may be folded or unfolded based on the slide movement of the first housing while rotating about a first rotation structure 361 thereof. For example, the first rotation structure 361 may be a pin. The hinge module 360 may be rotatably mounted to the connection structure 336 of the side wall member 330.

Figure 14:
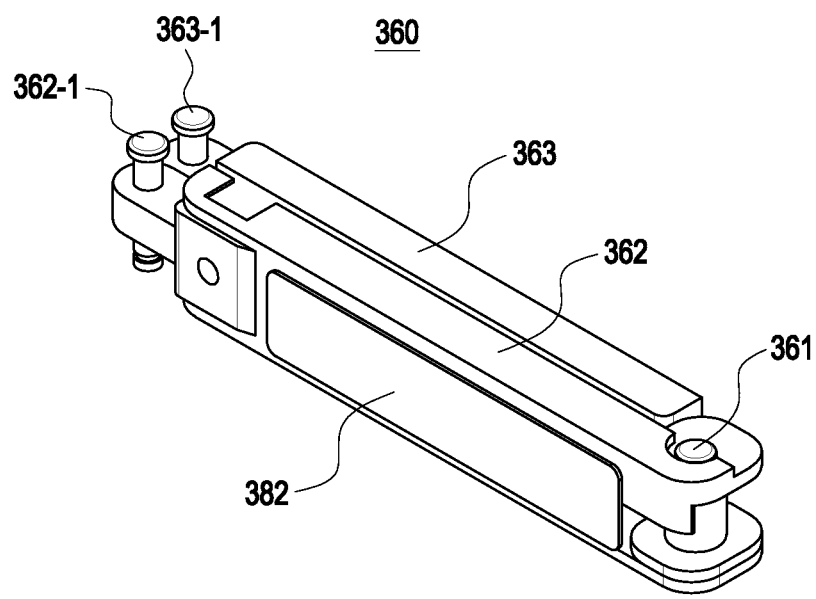
FIG. 14 illustrates a hinge module of an electronic device according to an embodiment.
Figure 15:
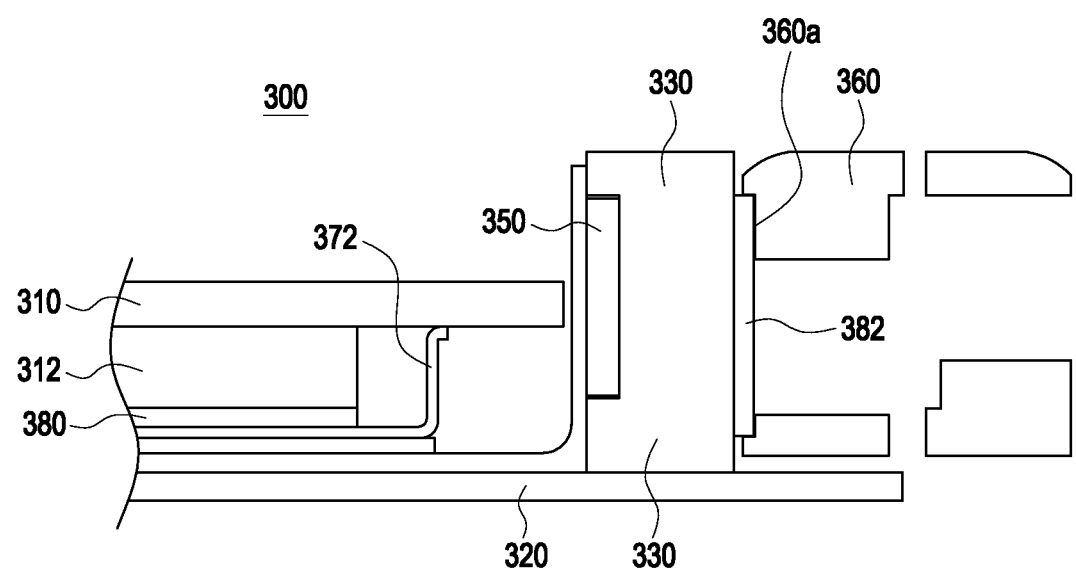
FIG. 15 illustrates a cross-sectional view of an electronic device according to an embodiment.
Figure 16:
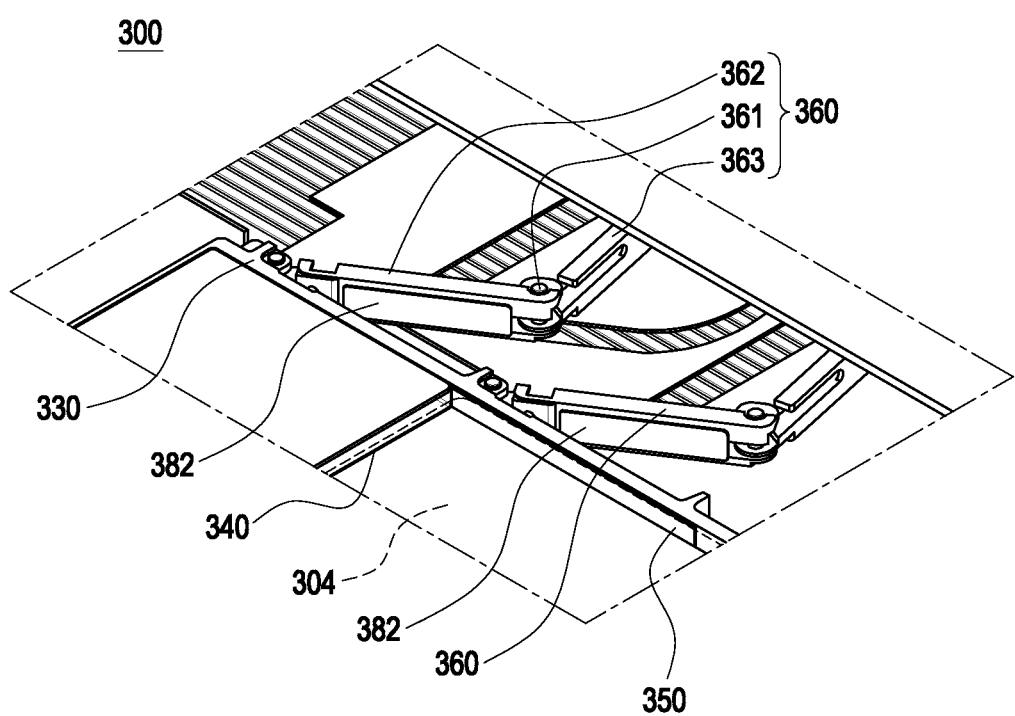
FIG. 16 illustrates an electronic device including a hinge module including a second heat dissipation adhesive member according to an embodiment.

FIG. 14 illustrates a hinge module of an electronic device according to an embodiment. FIG. 15 illustrates a cross-sectional view of an electronic device according to an embodiment. FIG. 16 illustrates an electronic device including a hinge module including a heat dissipation adhesive member according to an embodiment.

Referring to FIGS. 14 to 16, an electronic device 300 may include a battery 304, a PCB 310, an electronic component 312, a support member 320, a side wall member 330, a heat dissipation sheet 340, a heat dissipation member 350, a hinge module 360, and a first heat dissipation adhesive member 380.

The configurations of the electronic device 300, the battery 304, the PCB 310, the electronic component 312, the support member 320, the side wall member 330, the heat dissipation sheet 340, the heat dissipation member 350, the hinge member 360, and the first heat dissipation adhesive member 380 of FIGS. 14 to 16 may be the same in whole or in part as those of the electronic device 300, the battery 304, the PCB 310, the electronic component 312, the support member 320, the side wall member 330, the heat dissipation sheet 340, the heat dissipation member 350, the hinge module 360, and the first heat dissipation adhesive member 380 of FIG. 6 and/or FIG. 10.

The hinge module 360 may be unfolded or folded about one rotation shaft. For example, the hinge module 360 may include a first rotation structure 361, a first bracket 362 configured to be rotatable relative to the first rotation structure 361, and a second bracket 363 configured to be rotatable relative to the first rotation structure 361. The first bracket 362 may include a second rotation structure 362-1 configured to be connected to a portion of the side wall member 330 (e.g., the connection structure 336 in FIG. 11). The second bracket 363 may include a third rotation structure 363-1 to be connected to the first housing 301.

The hinge module 360 of the electronic device 300 may include a second heat dissipation adhesive member 382, which may increase the proportion at which the heat generated by the electronic component 312 is transferred to the hinge module 360. The second heat dissipation adhesive member 382 may be an adhesive member including a TIM. For example, the second heat dissipation adhesive member 382 may be made of a thermally conductive material having an adhesive property (e.g., a thermal paste, a thermal gap filler, a thermal adhesive, or a thermal tape). The second heat dissipation adhesive member 382 may be disposed on the first bracket 362 of the hinge module 360 and may at least partially face the side wall member 330. For example, at least a part of heat generated by the electronic component 312 may be transferred to the second heat dissipation adhesive member 382 via the heat dissipation member 350 and/or the side wall member 330. At least a part of the heat transferred to the second heat dissipation adhesive member 382 may be transferred to the hinge module 360. The second heat dissipation adhesive member 382 may be attached on the first hinge module surface 360a of the hinge module 360 facing the side wall member 330.

FIG. 17 illustrates an electronic device including a hinge module including a protrusion structure according to an embodiment.

Referring to FIG. 17, the electronic device 300 may include a side wall member 330 having at least one through hole 337 provided therein, and a hinge module 360 including a protrusion structure 364 that is capable of being inserted into the through hole 337. The configurations of the battery 304, the PCB 310, the electronic component 312, the side wall member 330, and the hinge module 360 of FIG. 17 may be the same in whole or in part as those of the battery 304, the PCB 310, the electronic component 312, the side wall member 330, and the hinge module 360 of FIG. 6 and/or FIG. 10.

The side wall member 330 includes at least one through hole 337. The through hole 337 may be a hole penetrating the space between a first side wall member surface (e.g., the first side wall member surface 330a in FIG. 6) and a second side wall member surface (e.g., the second side wall member surface 330b in FIG. 6). A heat dissipation member (e.g., the heat dissipation member 350 in FIG. 6) may be disposed on the side member 330 having a through hole 337 provided therein.

The hinge module 360 may include at least one protrusion structure 364. The protrusion structure 374 may be inserted into the through hole 337. For example, while the electronic device 300 is closed, at least a portion of the protrusion structure 374 may be located within the through hole 337. The protrusion structure 364 may be disposed on the first bracket of the hinge module 360 (e.g., the first bracket 362 in FIG. 14) or may extend from the first bracket 362.

Heat generated by the electronic component 312 may be diffused due to convection by air passing through the through hole 337. For example, the hinge module 360 may be folded or unfolded based on the sliding movement of the first housing (e.g., the first housing 201 in FIG. 2). The protrusion structure 364 may be inserted into the through hole 337 when the hinge module 360 is folded, and may be spaced apart from the through hole 337 when the hinge module 360 is unfolded. When the hinge module 360 moves, a flow of air may be generated inside the electronic device 300. Heat generated by the electronic component 312 may be transferred (e.g., by convection) to the internal space of the electronic device 300 by air passing through the through hole 337.

Figure 18:
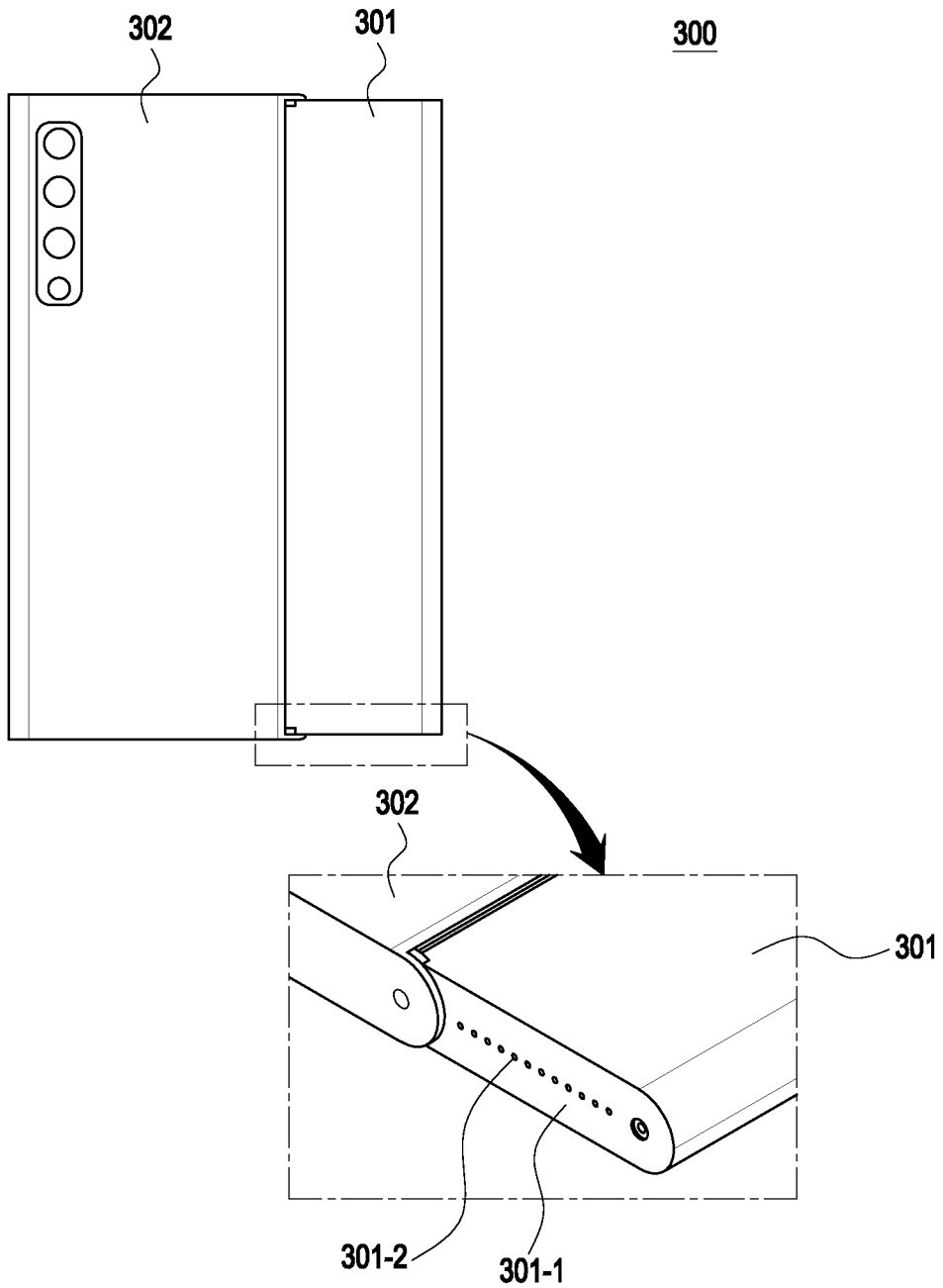
FIG. 18 illustrates an electronic device according to an embodiment.
Figure 19:
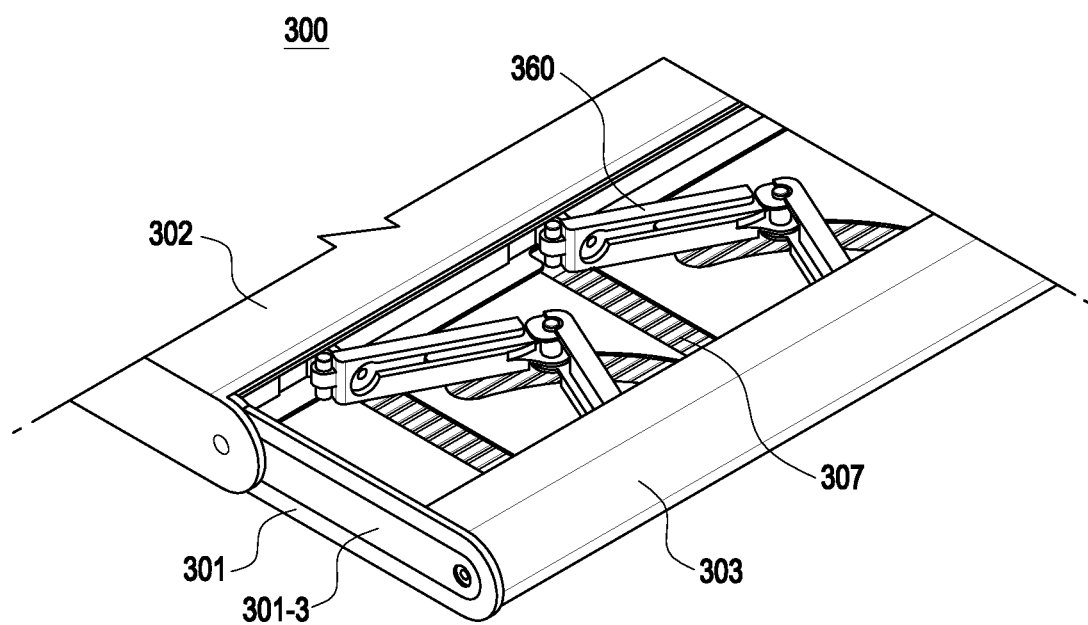
FIG. 19 illustrates an electronic device, from which a rear plate is omitted, according to an embodiment.

FIG. 18 illustrates an electronic device according to an embodiment. FIG. 19 illustrates an electronic device, from which a rear plate is omitted, according to an embodiment.

Referring to FIGS. 18 and 19, the electronic device 300 may include a first housing 301 and a second housing configured to accommodate the first housing 301 and guide the sliding movement of the first housing 301. The configurations of the first housing 301, the second housing 302, the display 303, the display support member 307, and the hinge module 360 of FIGS. 18 and 19 may be the same in whole or in part as those of the first housing 301, the second housing 302, the display 303, the display support member 307, and the hinge module 360 of FIGS. 4 and 5.

The first housing 301 includes at least one side member 301-1. The side member 301-1 may form at least a portion of the outer surface (e.g., a side surface) of the first housing 301. The area of the side member 301-1 exposed to the outside of the electronic device 300, while the electronic device 300 is opened (e.g., as illustrated in FIG. 3), may be larger than the area of the side member 301-1 exposed to the outside of the electronic device 300 while the electronic device 300 is closed (e.g., as illustrated in FIG. 2).

The first housing 301 may include at least one vent hole 301-2 configured to be exposed to the outside of the electronic device 300. The vent hole 301-2 may be provided in the side member 301-1. At least a portion of the at least one vent hole 301-2 may be exposed to the outside of the electronic device 300 while the electronic device 300 is open, and may be disposed inside and face the second housing 302 while the electronic device 300 is closed.

The outside and the inside of the electronic device 300 may be connected to one another through the vent hole 301-2. For example, the air inside the electronic device 300 may be delivered to the outside of the electronic device 300. The air inside the electronic device 300, which is heated by the heat generated by the electronic component (e.g., the processor 120 in FIG. 1), may move to the outside of the electronic device 300 through the vent hole 301-2, and the temperature of the electronic device 300 may be reduced. When the electronic device 300 is switched from the closed state to the open state, the hinge module 360 is switched from the folded state to the unfolded state, and the air inside the electronic device 300 is caused to flow based on the operation of the hinge module 360. Thereafter, the flowing air may move to the outside of the electronic device 300 through the vent hole 301-2. Since the air flows, heat generated by an electronic component may be diffused due to convection by the air passing through the vent hole 301-2.

The first housing 301 may include a protective cover 301-3. The protective cover 301-3 may reduce moisture or foreign matter introduced into the electronic device 300 through the vent hole 301-2. For example, the protective cover 301-3 may cover the vent hole 301-2.

At least a portion of the protective cover 301-3 may include a plurality of holes for blocking or reducing the flow of liquid or foreign matter. For example, at least a portion of the protective cover 301-3 may be configured in a mesh shape.

According to an embodiment of the disclosure, an electronic device (e.g., the electronic device 200 in FIG. 2) may include a housing (e.g., the housings 201 and 202 in FIG. 2) including a first housing (e.g., the first housing 201 in FIG. 2) and a second housing (e.g., the second housing 201 in FIG. 2) configured to accommodate at least a portion of the first housing and to guide the sliding movement of the first housing; a display (e.g., the display 203 in FIG. 3) including a first display area (e.g., the first display area A1 in FIG. 3) disposed on the first housing and a second display area (e.g., the second display area A2 in FIG. 3) extending from the first display area; a printed circuit board (e.g., the printed circuit board 310 in FIG. 6) disposed in the housing and configured to accommodate at least one electronic component (e.g., the electronic component 312 in FIG. 6); a support member disposed in the housing and configured to support the printed circuit board (e.g., the support member 320 in FIG. 6); a side wall member connected to the support member and facing at least a portion of the first housing (e.g., the side wall member 330 in FIG. 6); a heat dissipation sheet (e.g., the heat dissipation sheet 340 in FIG. 6) configured to receive heat from the at least one electronic component, the heat dissipation sheet being disposed on the support member and the side wall member; and a heat dissipation member (e.g., the heat dissipation member 350 in FIG. 6) disposed on the side wall member and facing the heat dissipation sheet.

The support member may include a first support member surface (e.g., the first support member surface 320*a* in FIG. 6) facing the printed circuit board and a second support member surface (e.g., the second support member surface 320*b* in FIG. 6) facing the display, the side wall member may include a first side wall member surface (e.g., the first side wall member surface 330*a* in FIG. 6) facing the printed circuit board and a second side wall member surface opposite to the first side wall member surface (e.g. a second side wall member surface 330*b* of FIG. 6), and the heat dissipation sheet may extend from the first support member surface to the first side wall member surface.

The electronic device may further include at least one hinge module (e.g., the hinge module 360 in FIG. 5) connected to the first housing and the side wall member.

The side wall member may include a plurality of fin structures (e.g., the fin structures 331 in FIG. 11) configured to face the at least one hinge module.

The side wall member may include a first accommodation groove (e.g., the first accommodation groove 333 in FIG. 8) facing the heat dissipation sheet and a second accommodation groove (e.g., the second accommodation groove 334 in FIG. 8) facing the hinge module, and the heat dissipation member may include a first heat dissipation member (e.g., the first heat dissipation member 352 in FIG. 8) disposed in the first accommodation groove, and a second heat dissipation member (e.g., the second heat dissipation member 354 in FIG. 8) disposed in the second accommodation groove.

The at least one hinge module may include a first bracket (e.g., the first bracket 362 in FIG. 14) connected to the side wall member, a second bracket (e.g., the second bracket 363 in FIG. 14) connected to the first housing and rotatably connected to the first bracket, and a second heat dissipation adhesive member (e.g., the second heat dissipation adhesive member 382 in FIG. 14) disposed on the first bracket and configured to receive heat from the side wall member.

The electronic device may further include a battery (e.g., the battery 304 in FIG. 10) disposed in the housing and configured to supply power to the at least one electronic component, the side wall member may include a first side wall area (e.g., the first side wall area 332 in FIG. 10) facing at least a portion of the printed circuit board and a second side wall area (e.g., the second side wall area 338 in FIG. 10) extending from the first side wall area and facing at least a portion of the battery, and the heat dissipation member may be disposed on the first side wall area and the second side wall area.

The PCB and the support member may be disposed in the second housing.

The side wall member may be integrated with the support member.

The electronic device may include a shielding member (e.g., the shielding member 370 in FIG. 6) disposed on the heat dissipation sheet and a first heat dissipation adhesive member (e.g., the first heat dissipation adhesive member 380 in FIG. 6) disposed on the shielding member and facing the at least one electronic component.

The side wall member may include at least one through hole (e.g., the through hole 337 in FIG. 17) facing the heat dissipation sheet.

The heat dissipation member may be disposed in the at least one through hole and may face the PCB.

The at least one through hole may be configured to accommodate at least one protrusion structure (e.g., the protrusion structure in FIG. 17) protruding from the at least one hinge module (e.g., the hinge module 360 in FIG. 5).

The first housing may include at least one vent hole (e.g., the vent hole 301-2 in FIG. 18) configured to be exposed to the outside of the electronic device, and a protective cover (e.g., the protective cover 301-3 in FIG. 19) configured to cover the at least one vent hole.

The heat dissipation sheet may include copper or graphite, and the heat dissipation member may include a heat pipe.

The first housing may be configured to slide relative to the second housing in a first direction, and the at least one hinge module may be configured to rotate about a second direction substantially perpendicular to the first direction in order to be unfolded or folded in the first direction.

According to an embodiment of the disclosure, an electronic device (e.g., the electronic device 200 in FIG. 2) may include: a housing (e.g., the housings 201 and 202 in FIG. 2) including a first housing (e.g., the first housing 201 in FIG. 2) and a second housing (e.g., the second housing 201 in FIG. 2) configured to accommodate at least a portion of the first housing and to guide the sliding movement of the first housing; a display (e.g., the display 203 in FIG. 3) including a first display area (e.g., the first display A1 in FIG. 3) disposed on the first housing and a second display area (e.g., the second display A2 in FIG. 3) extending from the first display area; a printed circuit board (e.g., the printed circuit board 310 in FIG. 6) disposed in the second housing and configured to accommodate at least one electronic component; a support structure (e.g., the support structure 308 in FIG. 6) disposed in the housing and configured to support the printed circuit board, the support structure including a support member (e.g., the support member 320 in FIG. 6) facing the at least one electronic component and a side wall member (e.g., the side wall member 330 in FIG. 6) extending from the support member; a heat dissipation sheet (e.g., the heat dissipation sheet 340 in FIG. 6) disposed on the support member and the side wall member; and at least one hinge module (e.g., the hinge module 360 in FIG. 5) connected to the first housing and the side wall member.

The side wall member may include a plurality of fin structures (e.g., the fin structures 331 in FIG. 11) configured to face the at least one hinge module.

The electronic device may further include a battery (e.g., the battery 304 in FIG. 10) disposed in the housing and configured to supply power to the at least one electronic component, and a heat dissipation member (e.g., the heat dissipation member 350 in FIG. 6) disposed on the side wall member and facing at least a portion of the heat dissipation sheet, the side wall member may include a first side wall area (e.g., the first side wall area 332 in FIG. 10) facing at least a portion of the printed circuit board and a second side wall area (e.g., the second side wall area 338 in FIG. 10) extending from the first side wall area and facing at least a portion of the battery, and the heat dissipation member may be disposed on the first side wall area and the second side wall area.

The side wall member may include a first accommodation groove (e.g., the first accommodation groove 333 in FIG. 8) facing the heat dissipation sheet and a second accommodation groove (e.g., the second accommodation groove 334 in FIG. 8) facing the hinge module, and the heat dissipation member may include a first heat dissipation member (e.g., the first heat dissipation member 352 in FIG. 8) disposed in the first accommodation groove, and a second heat dissipation member (e.g., the second heat dissipation member 354 in FIG. 8) disposed in the second accommodation groove.

The electronic device may include a shielding member (e.g., the shielding member 370 in FIG. 6) disposed on the heat dissipation sheet and a first heat dissipation adhesive member (e.g., the first heat dissipation adhesive member 380 in FIG. 6) disposed on the shielding member and facing the at least one electronic component.

The at least one hinge module may include a first bracket (e.g., the first bracket 362 in FIG. 14) connected to the side wall member, a second bracket (e.g., the second bracket 363 in FIG. 14) connected to the first housing and rotatably connected to the first bracket, and a second heat dissipation adhesive member (e.g., the second heat dissipation adhesive member 382 in FIG. 14) disposed on the first bracket and configured to receive heat from the side wall member.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device, comprising:
a first housing;
a second housing configured to accommodate at least a portion of the first housing and guide a sliding movement of the first housing;
a display including a first display area disposed on the first housing and a second display area extending from the first display area;
a printed circuit board (PCB) configured to accommodate at least one electronic component;
a support member configured to support the PCB;
a side wall member connected to the support member and facing at least a portion of the first housing;
a heat dissipation sheet configured to receive heat from the at least one electronic component, the heat dissipation sheet being disposed on the support member and the side wall member; and
a heat dissipation member disposed on the side wall member and facing the heat dissipation sheet.

2. The electronic device of claim 1, wherein the support member includes a first support member surface facing the PCB and a second support member surface facing the display,
wherein the side wall member includes a first side wall member surface facing the PCB and a second side wall member surface opposite to the first side wall member surface, and
wherein the heat dissipation sheet extends from the first support member surface to the first side wall member surface.

3. The electronic device of claim 1, further comprising at least one hinge module connected to the first housing and the side wall member.

4. The electronic device of claim 3, wherein the side wall member includes a plurality of fin structures configured to face the at least one hinge module.

5. The electronic device of claim 3, wherein the side wall member includes a first accommodation groove facing the heat dissipation sheet and a second accommodation groove facing the hinge module, and
wherein the heat dissipation member includes a first heat dissipation member disposed in the first accommodation groove, and a second heat dissipation member disposed in the second accommodation groove.

6. The electronic device of claim 3, wherein the at least one hinge module includes a first bracket connected to the side wall member, a second bracket connected to the first housing and rotatably connected to the first bracket, and a second heat dissipation adhesive member disposed on the first bracket and configured to receive heat from the side wall member.

7. The electronic device of claim 1, further comprising a battery configured to supply power to the at least one electronic component,
wherein the side wall member includes a first side wall area facing at least a portion of the PCB and a second side wall area extending from the first side wall area and facing at least a portion of the battery, and
wherein the heat dissipation member is disposed on the first side wall area and the second side wall area.

8. The electronic device of claim 1, wherein the PCB and the support member are disposed in the second housing.

9. The electronic device of claim 1, wherein the side wall member is formed integrally with the support member.

10. The electronic device of claim 1, further comprising:
a shielding member disposed on the heat dissipation sheet; and
a first heat dissipation adhesive member disposed on the shielding member and facing the at least one electronic component.

11. The electronic device of claim 1, wherein the side wall member includes at least one through hole facing the heat dissipation sheet.

12. The electronic device of claim 11, wherein the heat dissipation member is disposed in the at least one through hole and faces the PCB.

13. The electronic device of claim 11, wherein the at least one through hole is configured to accommodate at least one protrusion structure protruding from at least one hinge module.

14. The electronic device of claim 1, wherein the first housing includes at least one vent hole configured to be exposed to an outside of the electronic device and a protective cover configured to cover the at least one vent hole.

15. The electronic device of claim 1, wherein the heat dissipation sheet includes copper or graphite, and the heat dissipation member includes a heat pipe.

16. An electronic device, comprising:
a first housing;
a second housing configured to accommodate at least a portion of the first housing and to guide the sliding movement of the first housing;
a display including a first display area disposed on the first housing and a second display area extending from the first display area;
a printed circuit board (PCB) disposed in the second housing and configured to accommodate at least one electronic component;
a support structure configured to support the PCB, the support structure including a support member facing the at least one electronic component and a side wall member extending from the support member;
a heat dissipation sheet disposed on the support member and the side wall member; and
at least one hinge module connected to the first housing and the side wall member.

17. The electronic device of claim 16, wherein the side wall member includes a plurality of fin structures configured to face the at least one hinge module.

18. The electronic device of claim 16, further comprising:
a battery configured to supply power to the at least one electronic component; and
a heat dissipation member disposed on the side wall member and facing at least a portion of the heat dissipation sheet,
wherein the side wall member includes a first side wall area facing at least a portion of the PCB and a second side wall area extending from the first side wall area and facing at least a portion of the battery, and
wherein the heat dissipation member is disposed on the first side wall area and the second side wall area.

19. The electronic device of claim 18, wherein the side wall member includes a first accommodation groove facing the heat dissipation sheet and a second accommodation groove facing the hinge module, and
wherein the heat dissipation member includes a first heat dissipation member disposed in the first accommodation groove, and a second heat dissipation member disposed in the second accommodation groove.

20. The electronic device of claim 18, further comprising:
a shielding member disposed on the heat dissipation sheet; and
a first heat dissipation adhesive member disposed on the shielding member and facing the at least one electronic component.

* * * * *